(12) United States Patent
Ohashi et al.

(10) Patent No.: US 10,203,404 B2
(45) Date of Patent: Feb. 12, 2019

(54) ULTRASONIC SENSOR AND MANUFACTURING METHOD FOR THE SAME

(71) Applicant: Seiko Epson Corporation, Tokyo (JP)

(72) Inventors: Koji Ohashi, Matsumoto (JP); Chikara Kojima, Matsumoto (JP); Hikaru Iwai, Shiojiri (JP)

(73) Assignee: Seiko Epson Corporation (JP)

( * ) Notice: Subject to any disclaimer, the term of this patent is extended or adjusted under 35 U.S.C. 154(b) by 284 days.

(21) Appl. No.: 15/076,999

(22) Filed: Mar. 22, 2016

(65) Prior Publication Data

US 2016/0282454 A1 Sep. 29, 2016

(30) Foreign Application Priority Data

Mar. 24, 2015 (JP) .................................. 2015-061755

(51) Int. Cl.
G01S 7/521 (2006.01)
B06B 1/06 (2006.01)
(Continued)

(52) U.S. Cl.
CPC ............ *G01S 7/521* (2013.01); *B06B 1/0629* (2013.01); *G01S 7/524* (2013.01); *G01S 7/526* (2013.01); *H01L 41/25* (2013.01)

(58) Field of Classification Search
CPC combination set(s) only.
See application file for complete search history.

(56) References Cited

U.S. PATENT DOCUMENTS 6,222,303 B1 * 4/2001 Nakamura ........... B41J 2/14274
257/E27.006
6,623,111 B2 * 9/2003 Nakatani .............. B41J 2/14274
310/328
(Continued)

FOREIGN PATENT DOCUMENTS

EP 0936684 A1 8/1999
EP 2674227 A2 12/2013
(Continued)

OTHER PUBLICATIONS

Extended European Search Report for Application No. EP 16 16 0754 dated Jul. 18, 2016 (7 pages).

*Primary Examiner* — Isam A Alsomiri
*Assistant Examiner* — Amie M Ndure
(74) *Attorney, Agent, or Firm* — Harness, Dickey & Pierce, P.L.C.

(57) ABSTRACT

An ultrasonic sensor includes: a substrate disposed across an XY plane; a plurality of spaces formed in the substrate in at least one direction of an X-axis direction and a Y-axis direction; a vibrating plate that is provided on the substrate such that the spaces are enclosed and that has a first surface on the substrate side and a second surface facing the first surface; a piezoelectric element that is provided at a portion on the second surface side of the vibrating plate that corresponds to the space and that transmits and/or receives an ultrasonic wave; a surrounding plate that is provided on the second surface side of the vibrating plate and surrounds a peripheral region of the piezoelectric element; and a support member provided at a position, at which the support member is not overlapped with the piezoelectric element, between a surface of the surrounding plate on the piezoelectric element side and the second surface of the vibrating plate.

19 Claims, 18 Drawing Sheets

(51) Int. Cl.
   *G01S 7/524* (2006.01)
   *G01S 7/526* (2006.01)
   *H01L 41/25* (2013.01)

(56) References Cited

U.S. PATENT DOCUMENTS

| | | | |
|---|---|---|---|
| 6,724,129 B2* | 4/2004 | Nakatani | H01L 41/29 310/328 |
| 8,040,025 B2* | 10/2011 | Ohmori | C04B 38/008 310/328 |
| 2007/0040477 A1* | 2/2007 | Sugiura | B06B 1/0629 310/324 |
| 2009/0168603 A1 | 7/2009 | Okuda et al. | |
| 2011/0257352 A1 | 10/2011 | Gao et al. | |
| 2013/0258803 A1* | 10/2013 | Nakamura | B06B 1/0622 367/7 |
| 2014/0157902 A1 | 6/2014 | Sugiura et al. | |

FOREIGN PATENT DOCUMENTS

| | | |
|---|---|---|
| JP | 2009-225419 A | 10/2009 |
| JP | 2010-210283 A | 9/2010 |
| JP | 2011-255024 A | 12/2011 |
| JP | 2011-259274 A | 12/2011 |
| WO | WO-2010-073920 A1 | 7/2010 |

* cited by examiner

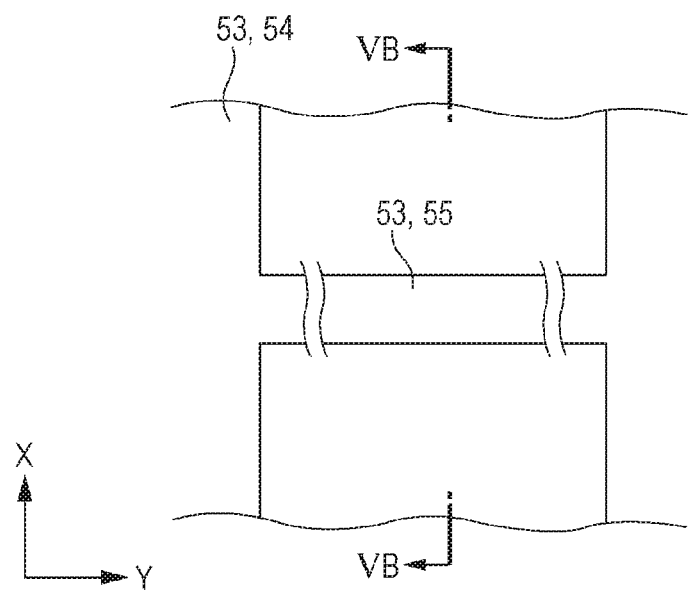
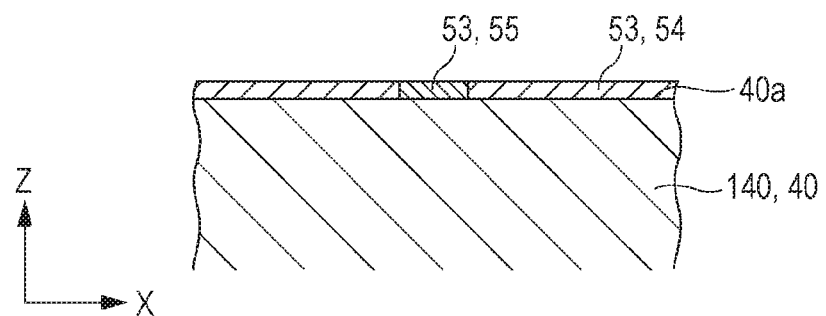

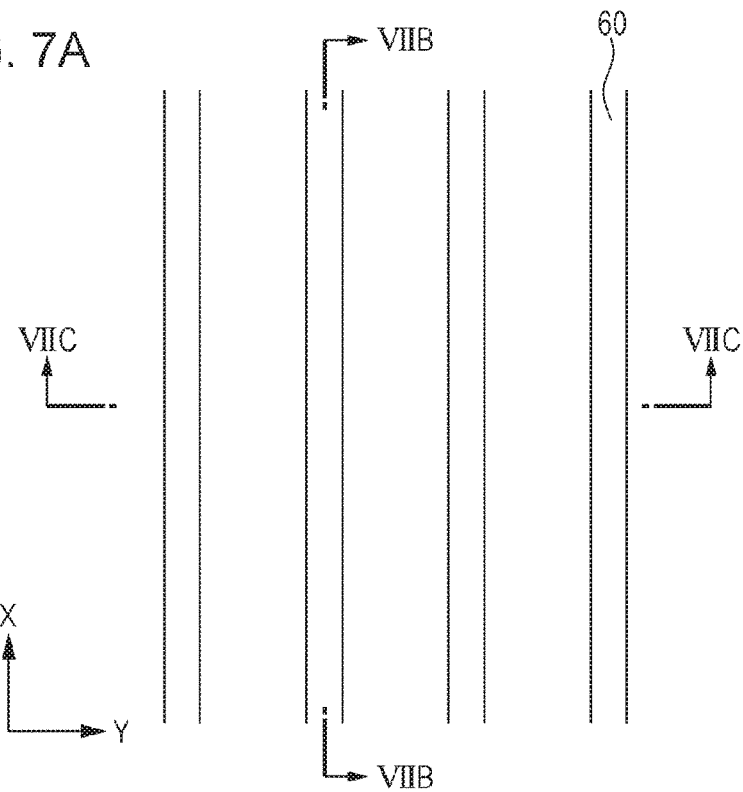
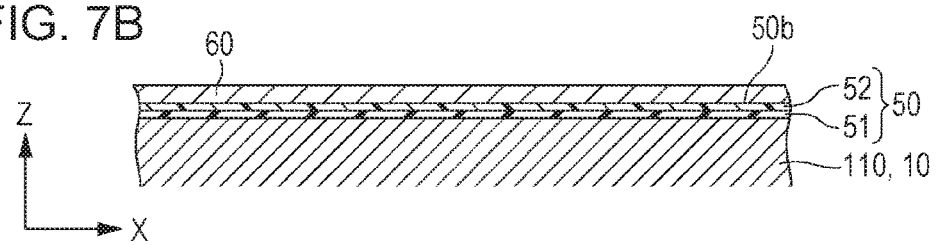
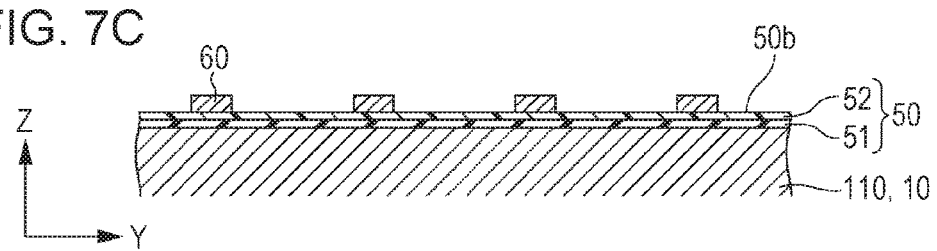

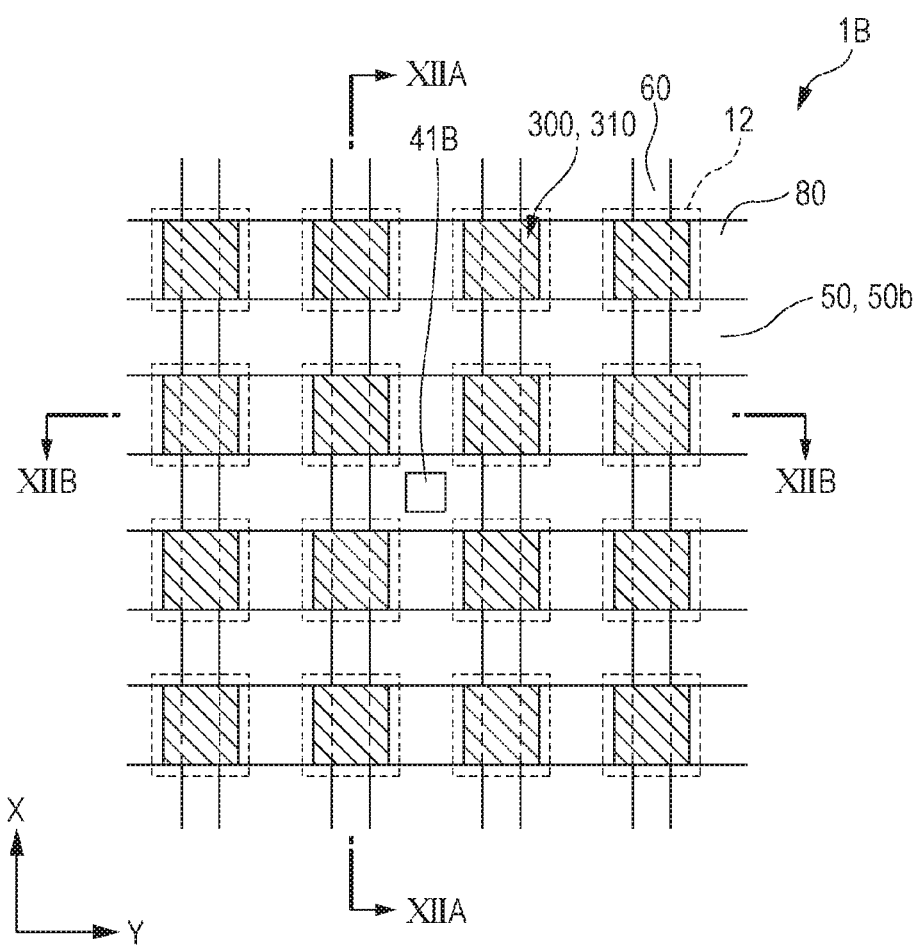

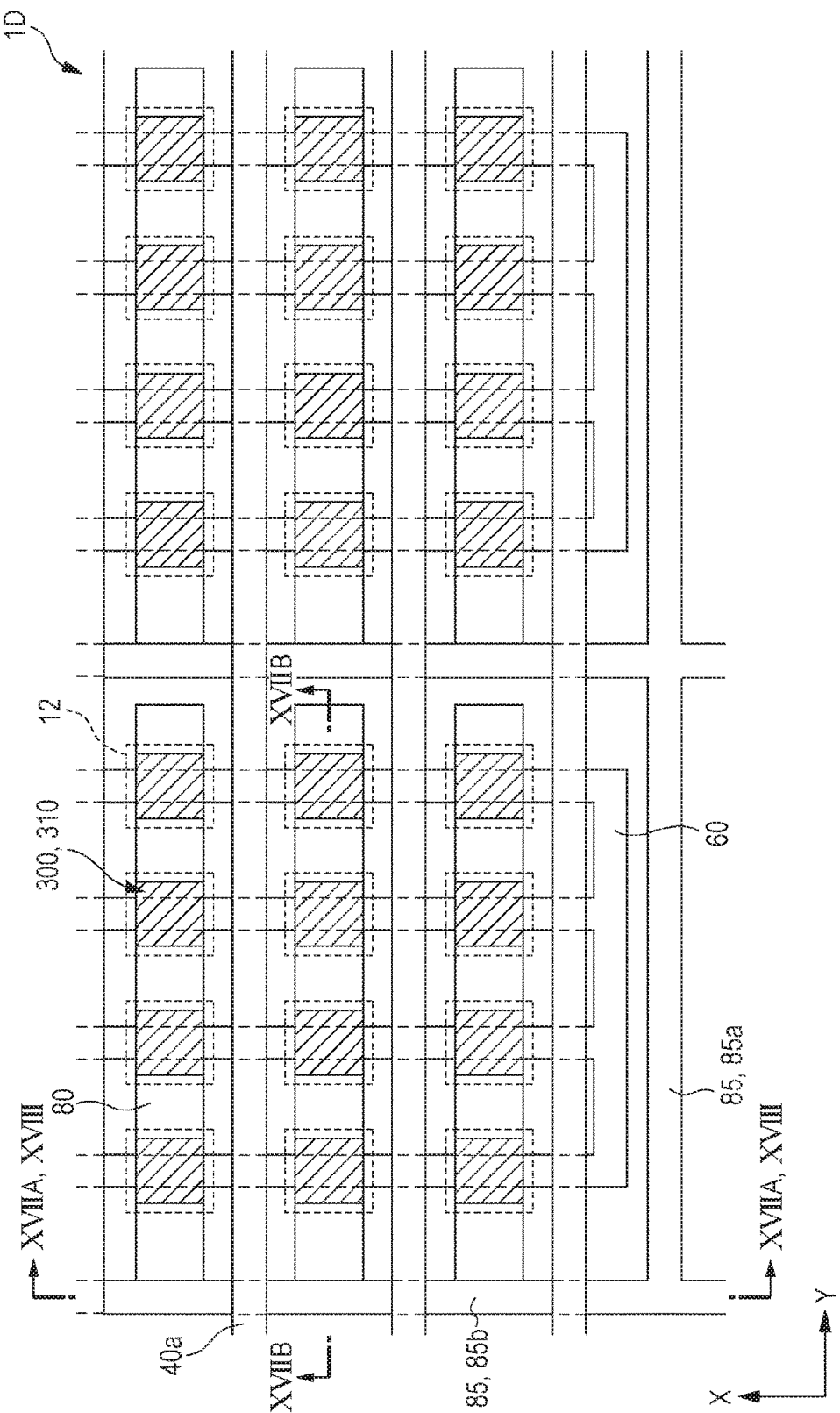

ULTRASONIC SENSOR AND MANUFACTURING METHOD FOR THE SAME

BACKGROUND

1. Technical Field

The present invention relates to an ultrasonic sensor and a manufacturing method for the ultrasonic sensor.

2. Related Art

In the related art, there is an ultrasonic sensor that includes a piezoelectric element which transmits and/or receives an ultrasonic wave, a vibrating plate in which the piezoelectric element is provided, and an sonic adjustment layer which propagates the ultrasonic wave. For example, there is an ultrasonic sensor that includes an electromechanical conversion element (piezoelectric element), a movable film (vibrating plate), and a sonic propagation member (sonic adjustment layer) provided in an opening (space) on a side of the movable film, which is opposite to the electromechanical conversion element (see JPA-2011-255024 (claims 1 and 2, a paragraph [0054], and the like) and JP-A-2011-259274 (paragraphs [0051] and [0053], FIG. 6, and the like)).

Both the ultrasonic sensors in JP-A-2011-255024 and JP-A-2011-259274 are classified as a type (so-called CAV surface type) in which a side of the vibrating plate, which is opposite to the piezoelectric element, is an ultrasonic wave passing region. In both JP-A-2011-255024 and JP-A-2011-259274, it is proposed that a sealing member, which seals the piezoelectric element, is provided on the piezoelectric element side of the vibrating plate. A recessed portion is formed at the center of the recessed portion and the sealing member covers the peripheral region of the piezoelectric element.

However, in JP-A-2011-255024 and JP-A-2011-259274, in the case of providing the sealing member, a problem arises in that it is difficult to ensure high reliability. In other words, in a case where a plurality of piezoelectric elements are collectively arranged, an opening area of the recessed portion formed in the sealing member is increased. In this case, when predetermined pressure is applied to the vibrating plate from the sonic adjustment layer side, the vibrating plate is significantly deflected in the recessed portion of the sealing member and, as a result, there is a concern that structural distortion will occur, and thus, reliability will be decreased. Depending on cases, there is a concern that cracking will appear on the respective members. This is not a problem limited to the ultrasonic sensors disclosed in JP-A-2011-255024 and JP-A-2011-259274, but every CAV surface type ultrasonic sensor has the same problem.

SUMMARY

An advantage of some aspects of the invention is to provide a CAV surface type ultrasonic sensor and a manufacturing method for the ultrasonic sensor in which it is possible to ensure high reliability.

According to an aspect of the invention, an ultrasonic sensor includes: when two orthogonal axes are referred to as an X axis and a Y axis and a plane formed by the X axis and the Y axis is referred to as an XY plane, a substrate disposed across the XY plane; a plurality of spaces formed in the substrate in at least one direction of an X-axis direction and a Y-axis direction; a vibrating plate that is provided on the substrate such that the spaces are enclosed and that has a first surface on the substrate side and a second surface facing the first surface; a plurality of piezoelectric elements that are provided at a portion on the second surface side of the vibrating plate that corresponds to the space and that transmit and/or receive an ultrasonic wave; a surrounding plate that is provided on the second surface side of the vibrating plate and that surrounds peripheral regions of the plurality of piezoelectric elements; and a support member provided at a position, at which the support member is not overlapped with the piezoelectric element, between a surface of the surrounding plate on the piezoelectric element side and the second surface of the vibrating plate.

In this case, the vibrating plate can be supported by the support member. Therefore, when a lens member is mounted or when adhesiveness of the lens member is to be ensured after the lens member is mounted, the vibrating plate is prevented from being significantly deflected in the recessed portion of the surrounding plate even when predetermined pressure is applied to the vibrating plate, from a sonic adjustment layer side. Hence, it is possible to suppress structural distortion and it is possible to ensure high reliability.

Further, in this case, the support member is provided at the position at which the support member is not overlapped with the piezoelectric element. Therefore, the piezoelectric element avoids being excessively restricted by the support member. Hence, an excessive decrease in transmission efficiency or reception efficiency of the ultrasonic wave is prevented, compared to a case where the support member is not provided.

In the ultrasonic sensor, it is preferable that the support member have a beam shape extending in one direction of the X-axis direction and the Y-axis direction. In this case, the vibrating plate can be supported by the support member in a broad range over the X-axis direction or the Y-axis direction. Hence, it is possible to ensure higher reliability.

In the ultrasonic sensor, it is preferable that the support members be juxtaposed in another direction intersecting with the one direction of the X-axis direction and the Y-axis direction. In this case, the vibrating plate can be supported by the support member in a broad range over the X-axis direction and the Y-axis direction. Hence, it is possible to ensure higher reliability.

In the ultrasonic sensor, it is preferable that the support member have a column shape and is in contact with the surrounding plate only in a Z-axis direction, when an axis orthogonal to both the X axis and the Y axis is referred to as a Z axis. In this case, the vibrating plate can be supported by the support member at a particular target position. Hence, it is possible to ensure high reliability.

In the ultrasonic sensor, it is preferable that the support members be juxtaposed in at least one direction of the X-axis direction and the Y-axis direction. In this case, the vibrating plate can be supported by the support member in a broad range including the particular target position. Hence, it is possible to ensure high reliability.

In the ultrasonic sensor, it is preferable that the piezoelectric element be configured to have a first electrode which is formed on the substrate, a piezoelectric layer which is formed on the first electrode, and a second electrode which is formed on the piezoelectric layer. It is preferable that one electrode of the first electrode and the second electrode be an individual electrode used to drive each column or each set of a plurality of columns, and the other electrode is a common electrode. It is preferable that a bypass electrode be provided so as to be overlapped with at least one electrode of the first electrode and the second electrode, and/or so as to be continuous to the second electrode. In this case, the bypass electrode is provided, thereby making it possible to achieve an averaged increase in impedance of the second electrode in some cases. Hence, in the ultrasonic sensor, it is possible to ensure high reliability and it is also possible to achieve improvement of the transmission efficiency or the reception efficiency of the ultrasonic wave.

In the ultrasonic sensor, it is preferable that the bypass electrode be provided to have a striped shape so as not to be provided in an adhering region of the surrounding plate and the support member to the vibrating plate. In this case, it is easy for the surrounding plate to adhere to the ultrasonic sensor element side. In addition, there is no concern that the bypass electrode has an adverse effect on the adhesiveness of the surrounding plate and the support member to the ultrasonic sensor element. Hence, it is possible to ensure high reliability.

According to another aspect of the invention, a manufacturing method for an ultrasonic sensor, in which the ultrasonic sensor includes, when two orthogonal axes are referred to as an X axis and a Y axis and a plane formed by the X axis and the Y axis is referred to as an XY plane, a substrate disposed across the XY plane, a plurality of spaces formed in the substrate in at least one direction of an X-axis direction and a Y-axis direction, a vibrating plate that is provided on the substrate such that the spaces are enclosed and that has a first surface on the substrate side and a second surface facing the first surface, a plurality of piezoelectric elements that is provided at a portion on the second surface side of the vibrating plate that corresponds to the space, and that transmits and/or receives an ultrasonic wave, and a surrounding plate that is provided on the second surface side of the vibrating plate and that surrounds peripheral regions of the plurality of piezoelectric elements. The manufacturing method for the ultrasonic sensor includes: providing a support member at a position, at which the support member is not overlapped with the piezoelectric element, between a surface of the surrounding plate on the piezoelectric element side and the second surface of the vibrating plate. In this case, it is possible to manufacture an ultrasonic sensor in which it is possible to suppress structural distortion and it is possible to ensure high reliability.

It is preferable that the manufacturing method for an ultrasonic sensor further include: producing, through wet-etching, the support member which has a beam shape extending in one direction of the X-axis direction and the Y-axis direction. In this case, it is possible to easily manufacture the ultrasonic sensor in which the vibrating plate can be supported in a broad range.

It is preferable that the manufacturing method for an ultrasonic sensor further include: producing, through dry-etching, the support member which has a column shape and is in contact with the surrounding plate only in a Z-axis direction, when an axis orthogonal to both the X axis and the Y axis is referred to as a Z axis. In this case, it is possible to easily manufacture the ultrasonic sensor in which the vibrating plate can be supported at a particular target position.

BRIEF DESCRIPTION OF THE DRAWINGS

The invention will be described with reference to the accompanying drawings, wherein like numbers reference like elements.

FIGS. 5A and 5B are views illustrating a manufacturing example (surrounding plate side) of the ultrasonic sensor.

FIGS. 7A to 7C are views illustrating a manufacturing example (ultrasonic sensor element side) of the ultrasonic sensor.

FIG. 11 is a plan view illustrating the configurational example of the ultrasonic sensor.

FIG. 16 is a plan view illustrating the configurational example of the ultrasonic sensor.

DESCRIPTION OF EXEMPLARY EMBODIMENTS

Hereinafter, an embodiment of the invention will be described with reference to the drawings. The following description is provided to describe an aspect of the invention and it is possible to arbitrarily modify the aspect within the scope of the invention. In each drawing, the same reference symbol is assigned to the same member and, thus, description thereof is omitted.

Embodiment 1

Ultrasonic Device

Figure 1:
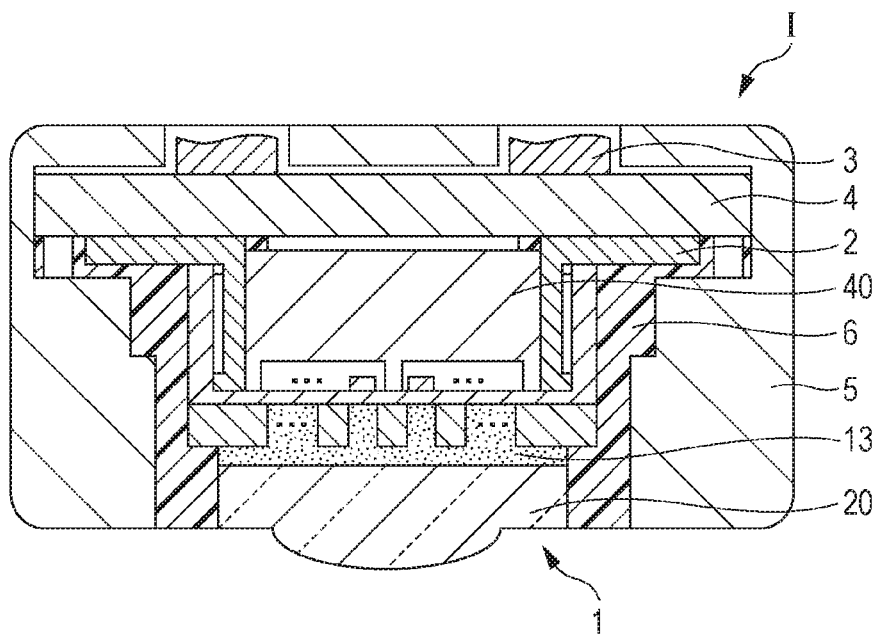
FIG. 1 is a sectional view illustrating a configurational example of an ultrasonic device.

FIG. 1 is a sectional view illustrating a configurational example of an ultrasonic device in which an ultrasonic sensor is mounted. As illustrated in FIG. 1, the ultrasonic probe I is configured to include a CAV surface type ultrasonic sensor 1, a flexible printed circuit board (FPC board 2) connected to the ultrasonic sensor 1, a cable 3 extending from an apparatus terminal (not illustrated), a relay substrate 4 that performs relay between the FPC board 2 and the cable 3, a housing 5 that protects the ultrasonic sensor 1, the FPC board 2, and the relay substrate 4, and a water-resistant resin 6 with which a gap between the housing 5 and the ultrasonic sensor 1 is filled.

An ultrasonic wave is transmitted from the ultrasonic sensor 1. In addition, an ultrasonic wave reflected from a measurement target object is received by the ultrasonic sensor 1. In an apparatus terminal of the ultrasonic probe I, information (a position, a shape, or the like) related to the measurement target object is detected, based on a waveform signal of the ultrasonic waves.

According to the ultrasonic sensor 1, as will be described below, it is possible to suppress structural distortion and it is possible to ensure high reliability. Therefore, when the ultrasonic sensor 1 is mounted in the ultrasonic device, the ultrasonic device has various good characteristics. The invention can be applied to any type of ultrasonic sensor such as a transmission-only type ultrasonic sensor optimized for transmission of an ultrasonic wave, a reception-only type ultrasonic sensor optimized for reception of an ultrasonic wave, and a transmission-reception integral type ultrasonic sensor optimized for transmission and reception of the ultrasonic wave. The ultrasonic device in which the ultrasonic sensor 1 can be mounted is not limited to the ultrasonic probe I.

Ultrasonic Sensor

Figure 2:
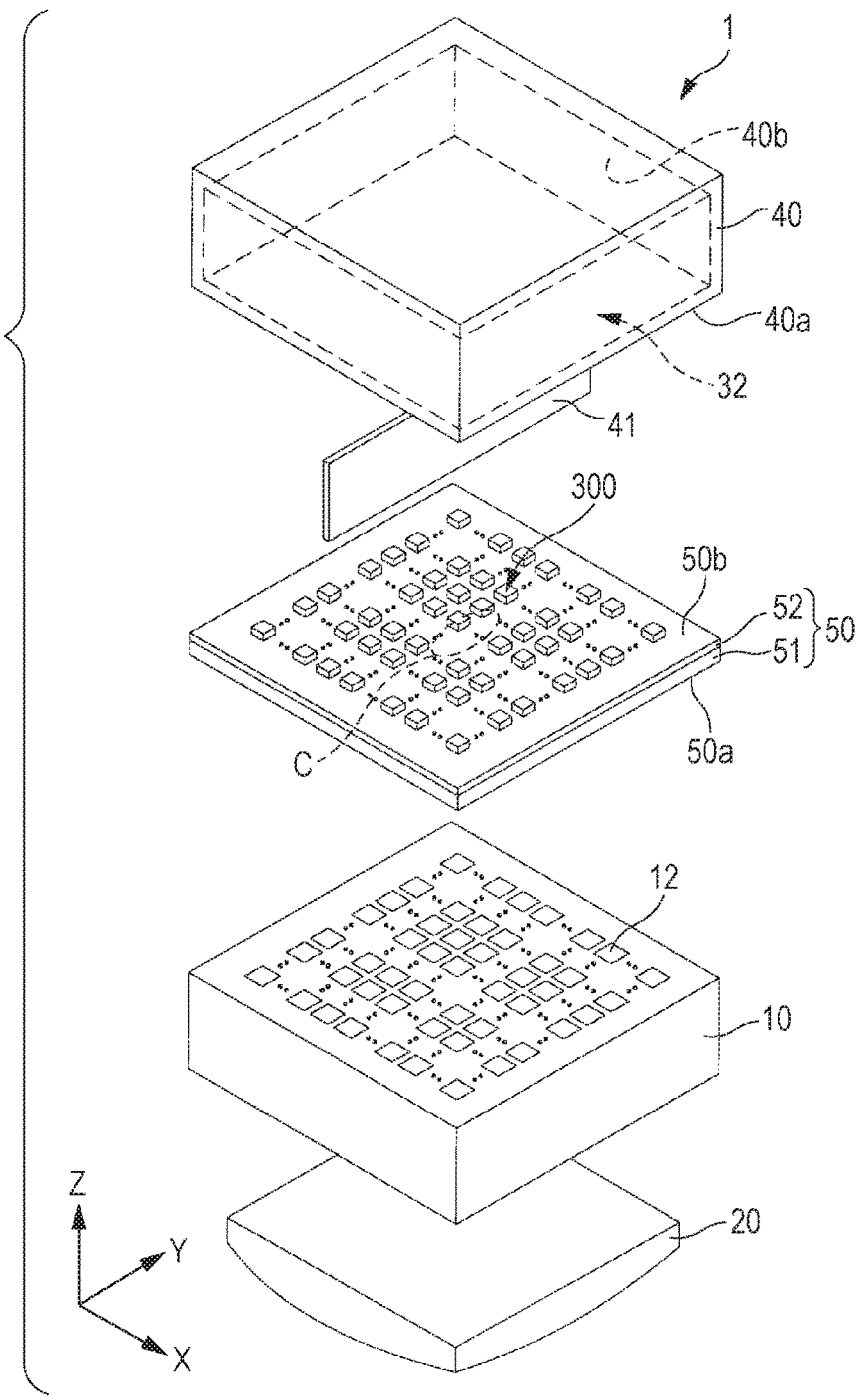
FIG. 2 is an exploded perspective view illustrating a configurational example of an ultrasonic sensor.
Figure 3:
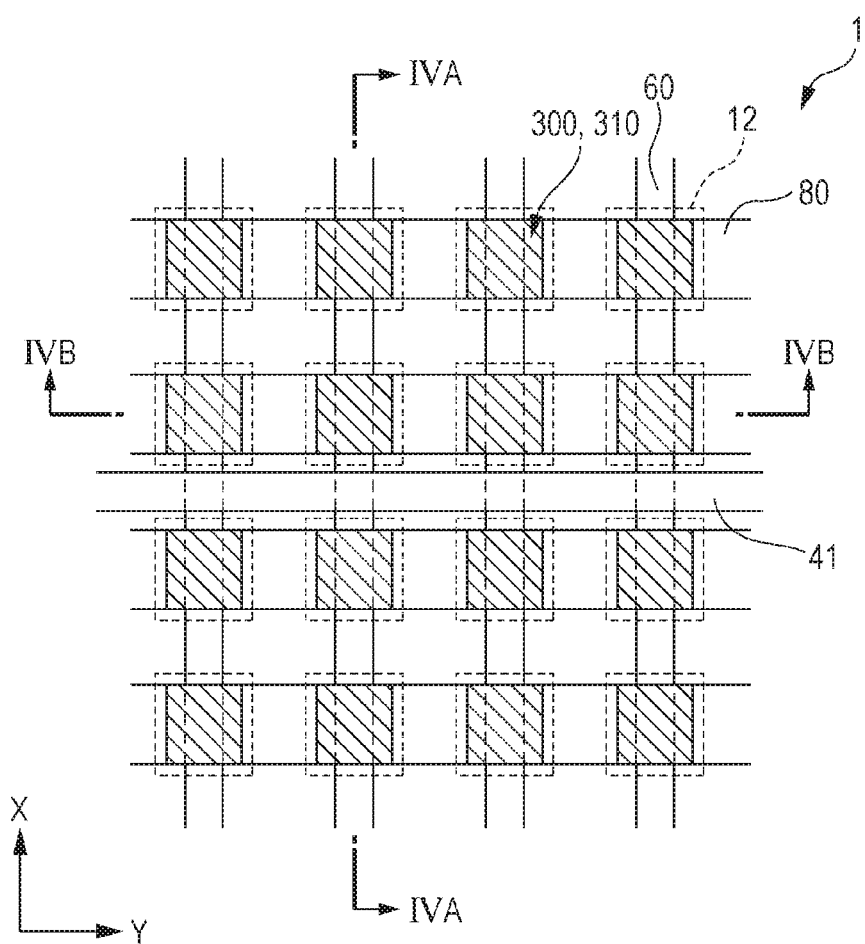
FIG. 3 is a plan view illustrating the configurational example of the ultrasonic sensor.
Figure 4A:
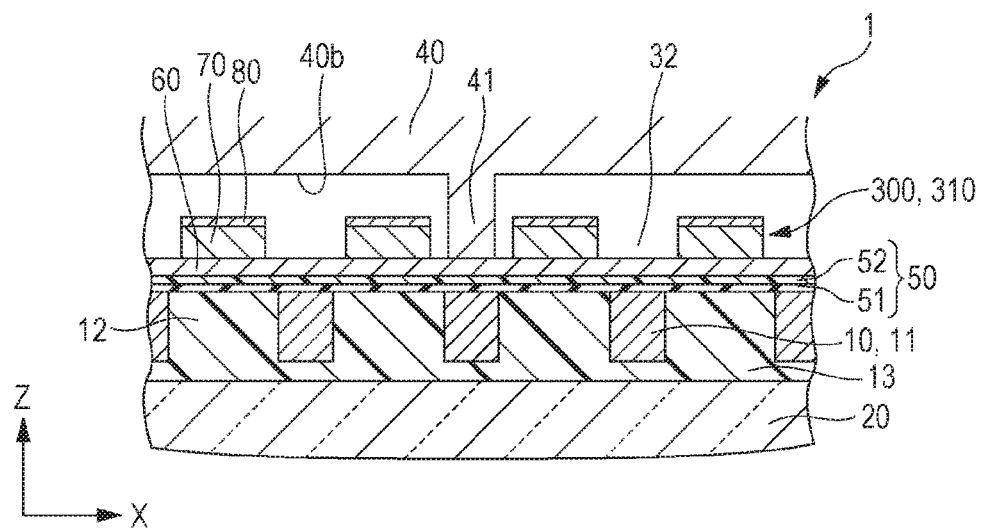
FIGS. 4A and 4B are sectional views illustrating the configurational example of the ultrasonic sensor.
Figure 4B:
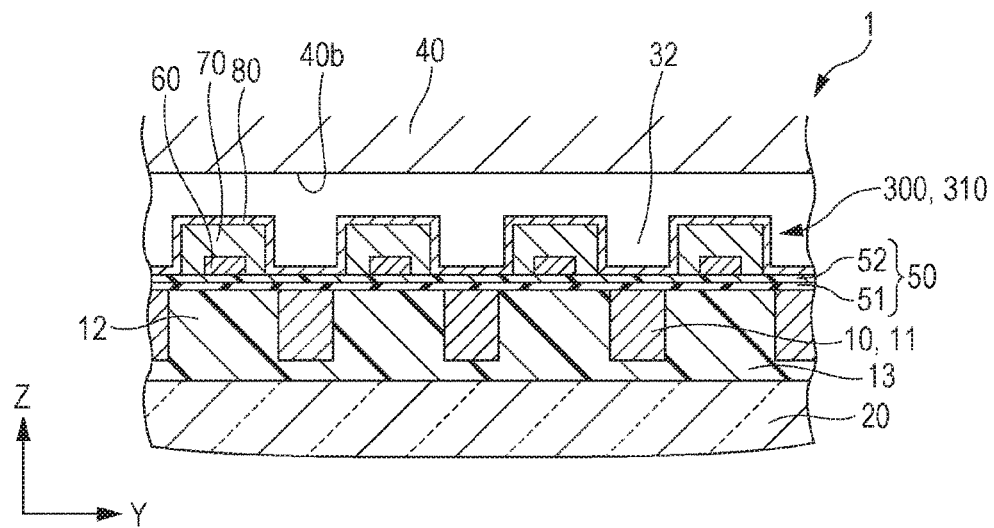

Next, a configurational example of the ultrasonic sensor 1 will be described. FIG. 2 is an exploded perspective view illustrating the ultrasonic sensor. FIG. 3 is a plan view of a substrate of the ultrasonic sensor. FIG. 4A is a sectional view taken along line IVA-IVA in FIG. 3. FIG. 4B is a sectional view taken along line IVB-IVB in FIG. 3.

When the substrate of the ultrasonic sensor is mounted across an XY plane formed by an X axis and a Y axis, the sectional view in FIG. 4A is shown across the XY plane formed by the X axis and the Y axis and the sectional view in FIG. 4B is shown across the YZ plane formed by the Y axis and the Z axis. Hereinafter, the X axis is referred to as a first direction X, the Y axis is referred to as a second direction Y, and the Z axis is referred to as a third direction Z.

The ultrasonic sensor 1 is configured to include an ultrasonic sensor element 310, a sonic adjustment layer 13, a lens member 20, and a surrounding plate 40. The ultrasonic sensor element 310 is configured to include a substrate 10, a vibrating plate 50, and a piezoelectric element 300. In FIG. 2, the surrounding plate 40 and a support member 41 are illustrated as individual bodies; however, both are integrally formed, in actuality.

A plurality of diaphragms 11 are formed on the substrate 10. The plurality of diaphragms 11 demarcate a plurality of spaces 12. For the substrate 10, a monocrystal silicon substrate can be used. The substrate 10 is not limited to the example described above; however, an SOI substrate, a glass substrate, or the like may be used.

The space 12 extends through the substrate 10 in the third direction Z. The plurality of spaces 12 are formed two-dimensionally, that is, both in the first direction X and the second direction Y. When the first direction X is a scanning direction and the second direction Y is a slicing direction, the ultrasonic sensor 1 performs scanning in the scanning direction and performs transmission and reception of the ultrasonic wave for each row extending in the slicing direction. In this manner, sensing information in the slicing direction can be continuously acquired in the scanning direction. The space 12 has a square shape (an aspect ratio of the lengths in the first direction X and the second direction Y is 1:1) when viewed in the third direction Z.

The arrangement or the shape of the space 12 can be variously modified. For example, the plurality of spaces 12 may be formed one-dimensionally, that is, in any one direction of the first direction X and the second direction Y. In addition, the space 12 may have a rectangular shape (the aspect ratio of the lengths in the first direction X and the second direction Y is not 1:1) when viewed in the third direction Z.

The vibrating plate 50 is provided on the substrate 10 so as to enclose the space 12. Hereinafter, a surface of the vibrating plate 50 on the substrate 10 side is referred to as a first surface 50a and the surface facing the first surface 50a is referred to as a second surface 50b. The vibrating plate 50 is configured to include an elastic film 51 disposed on the substrate 10 and an insulation layer 52 disposed on the elastic film 51. In this case, the first surface 50a is formed of the elastic film 51 and the second surface 50b is formed of the insulation layer 52.

The elastic film 51 is formed of silicon dioxide ($SiO_2$) or the like, and the insulation layer 52 is formed of zirconium oxide ($ZrO_2$) or the like. The elastic film 51 may not be a member separate from the substrate 10. A part of the substrate 10 is subjected to thinning and may be used as the elastic film. A total thickness of the vibrating plate and the substrate 10 is about 50 μm; however, the thickness is not limited to the above value. It is possible to appropriately select the total thickness of the vibrating plate 50 and the substrate 10 in consideration of flexibility, strength, or the like.

The piezoelectric element 300, which transmits and/or receives the ultrasonic wave, is provided in a portion on the second surface 50b side of the vibrating plate 50 that corresponds to the space 12. Hereinafter, the portion on the second surface 50b side of the vibrating plate 50 that corresponds to the space 12, is referred to as a movable section. The movable section is a section which vibrates due to displacement of the piezoelectric element 300. The ultrasonic wave is transmitted and/or received in the ultrasonic sensor 1 in response to the vibration produced in the movable section.

The piezoelectric element 300 is configured to have a first electrode 60 with a thickness of about 0.2 μm, a piezoelectric layer 70 with a thickness of equal to or less than about 3.0 μm, and preferably the thickness of about 0.5 μm to 1.5 μm, and a second electrode 80 with a thickness of about 0.05 μm.

Hereinafter, a portion interposed between the first electrode 60 and the second electrode 80 is referred to as a functional portion. In addition, in the present embodiment, at least the vibrating plate 50 and the first electrode 60 are displaced due to the displacement of the piezoelectric layer 70. In other words, in the present embodiment, at least the vibrating plate 50 and the first electrode 60 provide a function as actual vibrating plates. Here, one or both of the elastic film 51 and the insulation layer 52 is not provided and only the first electrode 60 may function as the vibrating plate. In a case where the first electrode 60 is directly provided on the substrate 10, it is preferable that the first electrode 60 be protected with a protective film or the like having insulating properties.

Although not illustrated in the drawings, another layer may be provided between the piezoelectric element 300 and the vibrating plate 50. For example, an adhesion layer for improving adhesiveness may be provided between the piezoelectric element 300 and the vibrating plate 50. Such an adhesion layer may be formed of, for example, a titanium oxide (TiOx) layer, a titanium (Ti) layer, or a silicon nitride (SiN) layer.

The piezoelectric element 300 is positioned in a region on the inner side of the space 12 when viewed in the third direction Z. In other words, the piezoelectric element 300 is shorter than the space 12 both in the first direction X and the second direction Y. Here, either the case where the piezoelectric element 300 is longer than the space 12 in the first direction X or the case where the piezoelectric element 300 is longer than the space 12 in the second direction Y is included in the invention.

The surrounding plate 40 is provided on the second surface 50*b* side of the vibrating plate 50. The recessed portion (piezoelectric element holding portion 32) is formed at the center of the surrounding plate 40 and the periphery of the piezoelectric element holding portion 32 is an edge portion 40*a* of the surrounding plate 40 (refer to FIG. 1). The piezoelectric element holding portion 32 covers a region on the periphery of the piezoelectric element 300 (region including the top surface and side surfaces of the piezoelectric element 300). Therefore, a surface corresponding to the bottom of the piezoelectric element holding portion 32 is a surface 40*b* of the surrounding plate 40 on the piezoelectric element 300 side.

The surrounding plate 40 adheres to the edge portion 40*a* on the ultrasonic sensor element 310 side. The adhesion of the surrounding plate 40 thereto can be performed using an adhesive (not illustrated); however, the method for the adhesion is not limited to the above example. The depth of the piezoelectric element holding portion 32, that is, the length in the third direction is about 80 μm; however, the depth is not limited to the above value. The depth of the piezoelectric element holding portion 32 may have a value by which a space is ensured to the extent that there is no interference with the driving of the piezoelectric element 300. In addition, the piezoelectric element holding portion 32 may be filled with air or may be filled with a resin. The thickness of the surrounding plate 40 is about 400 μm; however, the thickness is not limited to the above value.

In the ultrasonic sensor 1, the support member 41 is provided at a position, at which the support member is not overlapped with the piezoelectric element 300, between the surface 40*b* of the surrounding plate 40 on the piezoelectric element 300 side and the second surface 50*b* of the vibrating plate 50. In this manner, the vibrating plate can be supported by the support member 41. Therefore, when the lens member 20 is mounted or when adhesiveness of the lens member 20 is to be ensure after the lens member 20 is mounted, the vibrating plate 50 is prevented from being significantly deflected in the piezoelectric element holding portion 32, even when predetermined pressure is applied to the vibrating plate 50 from the sonic adjustment layer 13 side. Hence, it is possible to suppress structural distortion and it is possible to ensure high reliability.

The support member 41 is provided at the position at which the support member is not overlapped with the piezoelectric element 300. Therefore, the piezoelectric element 300 avoids being excessively restricted by the support member 41. Hence, an excessive decrease in transmission efficiency or reception efficiency of the ultrasonic wave is prevented, compared to a case where the support member 41 is not provided.

The position at which the support member is not overlapped with the piezoelectric element 300 is a position at which the support member is not overlapped with the functional portion described above (portion interposed between the first electrode 60 and the second electrode 80) when viewed in the third direction Z. Particularly, in the ultrasonic sensor 1, the support member 41 having a width narrower than the diaphragm 11 is provided between the adjacent spaces 12. In other words, in the ultrasonic sensor 1, when viewed in the third direction Z, the support member 41 is not overlapped with the movable section described above, either, (section on the second surface 50*b* of the vibrating plate 50 that corresponds to the space 12). Therefore, an excessive decrease in transmission efficiency or reception efficiency of the ultrasonic wave is reliably prevented, compared to a case where the support member 41 is not provided. The support member 41 adheres to the ultrasonic sensor element 310 side using the adhesive (not illustrated); however, the method for the adhesion is not limited thereto.

The support member 41 has a beam shape extending in the second direction Y. In this case, the vibrating plate can be supported in a broad range over the second direction Y. The support member 41 having the beam shape may not extend in the second direction Y, but may extend in the first direction X. One end portion of the support member 41 having the beam shape, on one side in an extending direction, may be separated from the edge portion 40*a* of the surrounding plate 40. As long as a member has at least the end portion on the one side in the extending direction, which is in contact with the edge portion 40*a* of the surrounding plate 40, the member is included in the support member 41 having the beam shape.

The support member 41 having the beam shape is produced through wet-etching of the surrounding plate 40. In this manner, the support member 41 is produced by using the constituent material of the surrounding plate 40, thereby having the same constitution as the surrounding plate 40. Wet-etching can be performed on a large region in a short time, although processing accuracy thereof is low, compared to dry-etching. Therefore, wet-etching is a technique suitable for producing the support member 41 having the beam shape.

The central portion of the piezoelectric element holding portion 32 is relatively separated from the edge portion 40*a* of the surrounding plate 40. Thus, a central position C (refer to FIG. 1) in the vibrating plate 50 that corresponds to the central portion of the piezoelectric element holding portion 32, is likely to have low rigidity in a case where the support member 41 is not provided. Therefore, the support member 41 is provided so as to support the central position C of the vibrating plate 50. In this manner, it is possible to ensure higher reliability.

In the invention, various selections can be performed for the number, arrangement, shape, or the like of the support members. For example, a plurality of support members may be provided. In this case, it is preferable that the support members be arranged at equal intervals in the piezoelectric element holding portion 32. In this manner, the entire vibrating plate 50 can be supported. Thus, it is preferable that three or a greater odd number of support members be provided. This is because the central support member can be positioned in the vicinity of the central position C of the vibrating plate 50, when the support members are arranged at equal intervals in the piezoelectric element holding portion 32. For example, a good balance is maintained when the number of the support members is about three.

The support members may be provided only in a portion shifted from the central position C of the vibrating plate 50. The support member may not have the beam shape. The support member may not have a straight line shape in the extending direction. An area ratio of the XY planes of the support member is different according to a position in the third direction Z, depending on a producing method for the support member; however, this case is included in examples of the support member of the invention as long as the vibrating plate can be supported.

In the piezoelectric element 300, any one electrode is a common electrode and the other electrode is an individual electrode. Here, the first electrode 60 is provided over the first direction X such that the individual electrode is formed, and the second electrode 80 is provided over the second direction Y such that the common electrode is formed. Here, in consideration of a circumstance of a driving circuit or wiring, the first electrode may be formed as the common electrode and the second electrode may be formed as the individual electrode.

There is no limitation to the material of the first electrode 60 and the second electrode 80, as long as the material has conductivity. Examples of the first electrode 60 and the second electrode 80 include a metallic material, a tin oxide-based conductive material, and an oxide conductive material. Examples of the metallic material include platinum (Pt), iridium (Ir), gold (Au), aluminum (Al), copper (Cu), titanium (Ti), stainless steel, or the like. Examples of the tin oxide-based conductive material include indium tin oxide (ITO), fluorine doped tin oxide (FTO)), or the like. Examples of the oxide conductive material include zinc oxide-based conductive material, strontium ruthenium oxide ($SrRuO_3$), lanthanum nickel oxide ($LaNiO_3$), element doped strontium titanate, or the like. The material of the first electrode 60 and the second electrode 80 may be a conductive polymer.

The piezoelectric layer 70 is configured to be subjected to patterning for each space 12 and is interposed between the first electrode 60 and the second electrode 80. The piezoelectric layer 70 is formed to contain a complex oxide having, for example, an $ABO_3$ type perovskite structure. When a non-lead-based material having a reduced content of lead is used as the complex oxide, it is possible to reduce an environment load. An example of the non-lead-based material includes for example, a KNN-based complex oxide containing potassium (K), sodium (Na), and niobium (Nb).

In the $ABO_3$ type perovskite structure, A site of an $ABO_3$ type structure is twelve fold coordinated by oxygen, and B site thereof is octahedrally six fold coordinated by oxygen. In the example using the KNN-based complex oxide, N and Na are positioned at the A site, Nb is positioned at the B site, and a composition formula thereof is expressed, for example, $(K,Na)NbO_3$.

Other elements may be contained in the KNN-based complex oxide. Examples of the other elements include lithium (Li), bismuth (Bi), barium (Ba), calcium (Ca), strontium (Sr), samarium (Sm), and cerium (Ce) which are replaced for a part of the A site of the piezoelectric layer 70, or manganese (Mn), zinc (Zn), zirconium (Zr), magnesium (Mg), Copper (Cu), aluminum (Al), nickel (Ni), cobalt (Co), chromium (Cr), and titanium (Ti) which are replaced for a part of the B site of the piezoelectric layer 70, and the like.

It is preferable that the KNN-based complex oxide do not contain lead; however, lead (Pb), which is replaced for a part of the A site, may be contained as another element. Examples of the other element are not limited thereto but include tantalum (Ta), antimony (Sb), silver (Ag), and the like. Two or more other elements may be contained. In general, an amount of the other elements is equal to or less than 15% of a total amount of the elements as main components, and preferably equal to or less than 10% thereof. The use of the other elements enables various characteristics to be enhanced and a configuration, a function, or the like to be achieved in various ways, in some cases. In the case where the complex oxide uses the other elements, it is also preferable that the complex oxide have the $ABO_3$ perovskite structure.

Examples of the non-lead-based material include, in addition to the KNN-based complex oxide described above, a BFO-based complex oxide including bismuth (Bi) and iron (Fe) or a BF-BT complex oxide including bismuth (Bi), barium (Ba), iron (Fe), and titanium (Ti). In the examples of the BFO-based complex oxide, Bi is positioned at the A site, Fe and Ti are positioned at the B site, and a composition formula thereof is expressed by $BiFeO_3$. In the examples of the BF-BT-based complex oxide, Bi and Ba are positioned at the A site, Fe and Ti are positioned at the B site, and a composition formula thereof is expressed by $(Bi,Ba)(Fe,Ti)O_3$.

The other elements may be contained in the BFO-based complex oxide or in the BF-BT-based complex oxide. Examples of the other elements are as described above. In addition, the elements forming the KNN-based complex oxide may be contained in the BFO-based complex oxide or in the BF-BT-based complex oxide.

The piezoelectric layer 70 may be formed of a complex oxide as a main component other than the non-lead-based material. An example of the complex oxide other than the non-lead-based material includes lead zirconate titanate ($Pb(Zr,Ti)O_3$; PZT)-based complex oxide. In this manner, it is easy to achieve displacement enhancement of the piezoelectric element 300. It is needless to say that the other elements may be contained in the PZT-based complex oxide. The examples of the other elements are as above.

Examples of the complex oxide having the $ABO_3$ type perovskite structure include a complex oxide obtained due to variations by deficit/excess in stoichiometric composition or a complex oxide obtained when some of the elements are replaced with the other elements. In other words, as long as the perovskite structure is obtained, not only unavoidable variations of composition due to lattice mismatch and oxygen deficiency, but also partial replacement of the elements or the like is allowed.

The ultrasonic sensor element 310 is configured to have the space 12 formed in the substrate 10, the vibrating plate 50, and the piezoelectric element 300. In the ultrasonic sensor element 310, in addition to the surrounding plate 40, the sonic adjustment layer 13 and the lens member 20 are provided, and the ultrasonic sensor 1 is configured.

The sonic adjustment layer 13 is provided in the space 12. The sonic adjustment layer 13 can prevent sonic impedance from rapidly changing between the piezoelectric element 300 and the measurement target object and, as a result, it is possible to prevent a reduction in the propagation efficiency of the ultrasonic wave. The sonic adjustment layer 13 can be formed of, for example, a silicone resin; however, the sonic adjustment layer is not limited to the example described above. It is possible to appropriately select a material according to use of the ultrasonic sensor.

The lens member 20 is provided on a side of the substrate 10 opposite to the vibrating plate 50. The lens member 20 plays a role in converging of the ultrasonic wave. The lens member 20 can be omitted in a case where the converging of the ultrasonic wave is performed through an electronic focus method, or the like. Here, the sonic adjustment layer 13 described above has a function of ensuring adhesion of the lens member 20 and the substrate 10 to each other. The ultrasonic sensor 1 is configured to include the sonic adjustment layer 13 which is interposed between the lens member 20 and the substrate 10 (diaphragm 11).

When the lens member 20 is mounted in the ultrasonic sensor element 310 or when adhesiveness of the lens member 20 is to be ensured after the lens member 20 is mounted, the lens member 20 is pressed to the sonic adjustment layer 13 side. Even in a case where the lens member 20 is not provided or in a case where another member is provided instead of the lens member, in order to ensure adhesiveness of the respective members, a pressing force is applied to the vibrating plate 50 from the sonic adjustment layer 13 side in some cases. Since the ultrasonic sensor 1 is configured to include the support member 41, as described above, it is possible to suppress the structural distortion and it is possible to ensure high reliability even when a predetermined external force is applied to the vibrating plate 50.

The ultrasonic sensor 1 is configured as a CAV surface type in which the side of the vibrating plate 50 opposite to the piezoelectric element 300 becomes an ultrasonic wave passing region. Accordingly, since a configuration, in which water moisture is unlikely to reach the piezoelectric element 300 from the outside, can be realized, the ultrasonic sensor 1 has good electrical safety during use. In a case where the piezoelectric element 300 and the vibrating plate 50 are thin films, the edge portion 40a of the surrounding plate 40, which is sufficiently thicker than the vibrating plate 50, and the support member 41 are bonded or adhere to the vibrating plate 50 so as to surround the piezoelectric element 300. Therefore, it is possible to improve workability during manufacturing and it is easy to work with the ultrasonic sensor 1.

Manufacturing Method

Figure 6A:
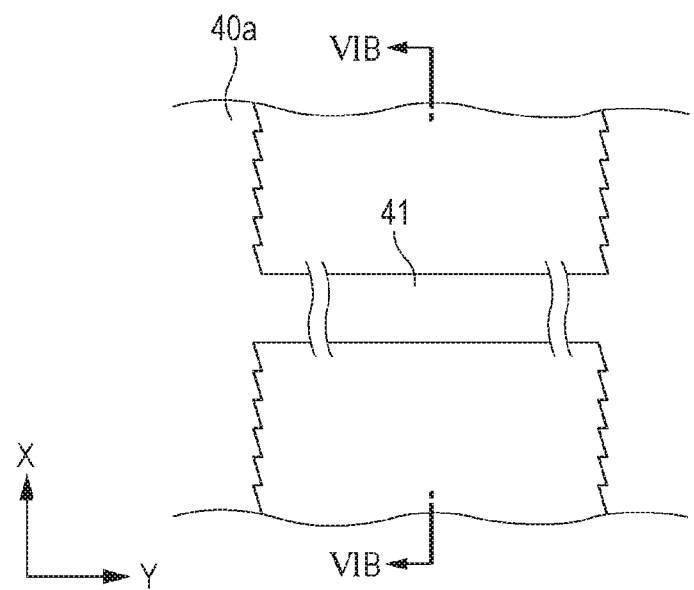
FIGS. 6A and 6B are views illustrating the manufacturing example (surrounding plate side) of the ultrasonic sensor.
Figure 6B:
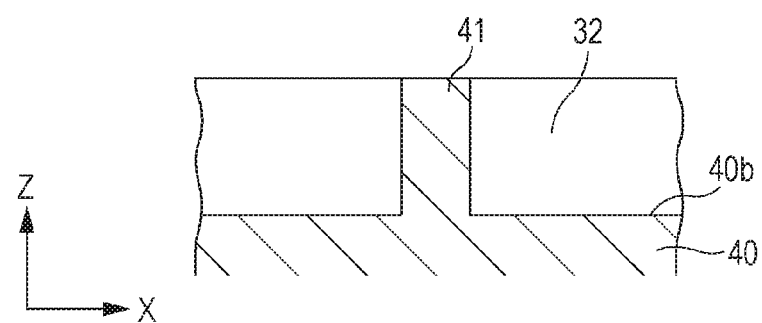
Figure 8A:
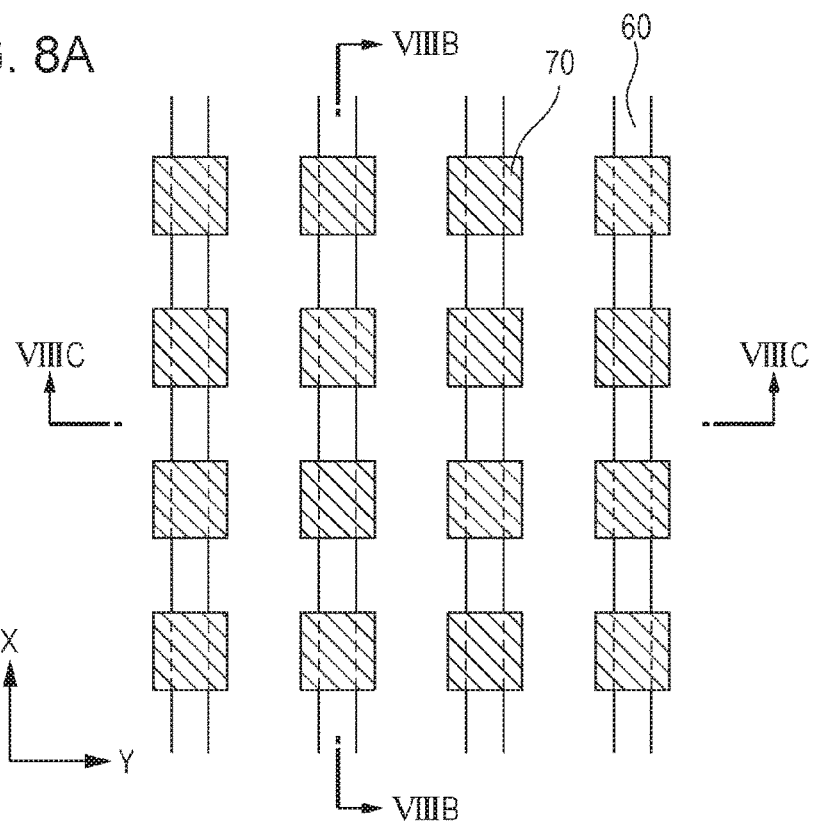
FIGS. 8A to 8C are views illustrating the manufacturing example (ultrasonic sensor element side) of the ultrasonic sensor.
Figure 8B:
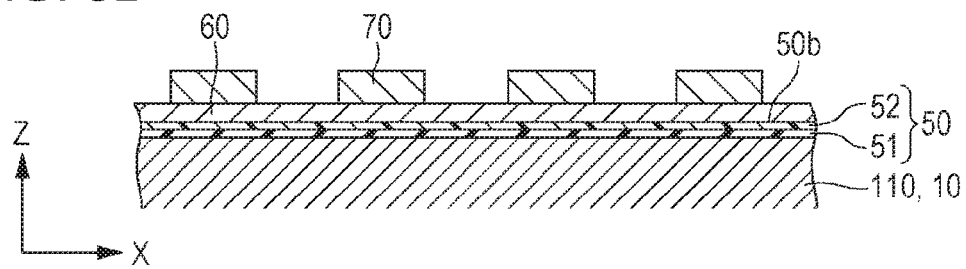
Figure 8C:
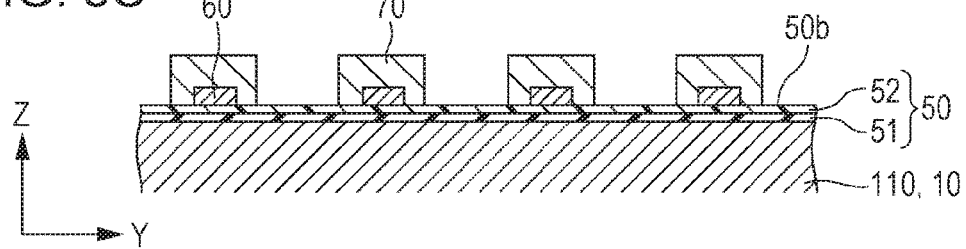
Figure 9A:
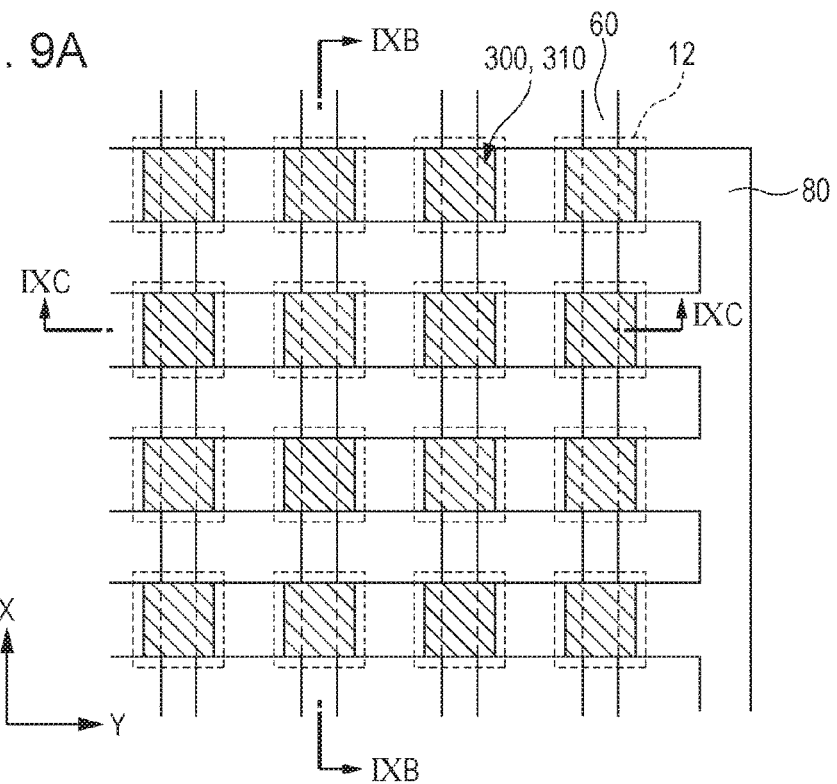
FIGS. 9A to 9C are views illustrating the manufacturing example (ultrasonic sensor element side) of the ultrasonic sensor.
Figure 9B:
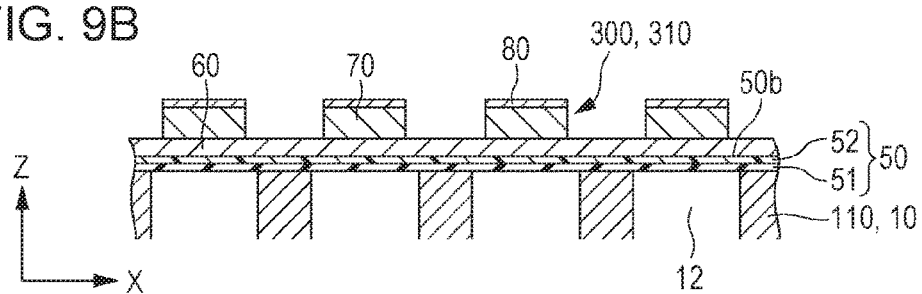
Figure 9C:
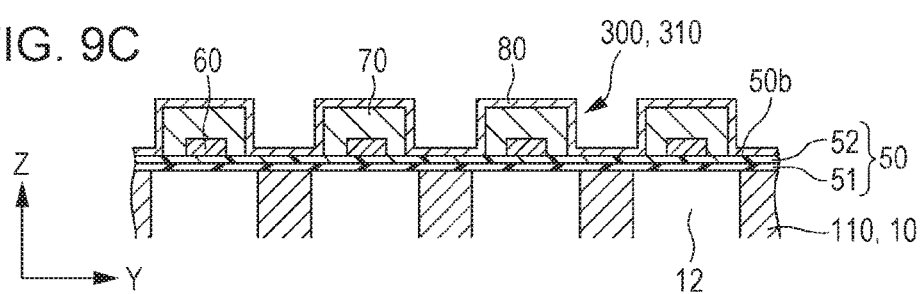

Next, an example of a manufacturing method for the ultrasonic sensor 1 will be described. FIGS. 5A to 9C illustrate respective processes of the manufacturing method for the ultrasonic sensor. FIGS. 5A and 6A are plan views in the third direction Z, respectively, and FIGS. 5B and 6B are sectional views taken along lines VB-VB and VIB-VIB, respectively. FIGS. 7A, 8A and 9A are plan views in the third direction Z, respectively, FIGS. 7B, 8B and 9B are sectional views taken along lines VIIB-VIIB, VIIIB-VIIIB, and IXB-IXB, respectively, and FIGS. 7C, 8C, and 9C are sectional views taken along lines VIIC-VIIC, VIIIC-VIIIC, and IXC-IXC, respectively. The lines VIIB-VIIB, VIIIB-VIIIB, and IXB-IXB are drawn in the first direction X and lines VIIC-VIIC, VIIIC-VIIIC, and IXC-IXC are drawn in the second direction Y.

FIGS. 5A to 6B illustrate processes of a manufacturing method performed on the surrounding plate 40 side, and FIGS. 7A to 9C illustrate processes of a manufacturing method performed on the ultrasonic sensor element 310 side. The processes in FIGS. 5A to 6B and the processes in FIGS. 7A to 9C may be reversed in the order.

First, as illustrated in FIGS. 5A and 5B, a resist (not illustrated) is provided on a surface of a silicon wafer 140 (40) for the surrounding plate, the resist is subjected to patterning to have a predetermined shape, and a mask film 53 is formed. Here, a mask film 54 is formed on the edge portion 40a of the silicon wafer 140 (40) for the surrounding plate and a mask film 55 is formed so as to be continuous from the mask film 54 and so as to extend in the second direction Y.

Also, as illustrated in FIGS. 6A and 6B, the silicon wafer 140 (40) for the surrounding plate is subjected to anisotropic etching (wet-etching) using an alkaline solution such as KOH, through the mask film 53. In this manner, the surrounding plate 40, in which the support member 41 and the piezoelectric element holding portion 32 are formed, is produced. Then, the mask film 54 remaining on the edge portion 40a or the mask film 55 remaining on the support member 41 are removed. Further, FIG. 6A is an enlarged view illustrating a coarse processing cross section. As described above, wet-etching is low in processing accuracy, compared to dry-etching, but it is possible to perform wet-etching on a large region in a short time.

In comparison, the elastic film 51 made of the silicon oxide is formed through thermal oxidation on the surface of a silicon wafer 110 (10) for the substrate. Then, a film made of zirconium is formed on the elastic film 51 and the insulation layer 52 made of zirconium oxide is formed through the thermal oxidation.

Also, as illustrated in FIGS. 7A to 7C, the first electrode 60 is formed on the insulation layer 52 using a sputtering method, a vapor deposition, or the like, and patterning is performed such that the first electrode 60 is formed to have a predetermined shape. Subsequently, the piezoelectric layer 70 is stacked on the first electrode 60 and the vibrating plate 50. The piezoelectric layer 70 can be formed using a chemical solution deposition (CSD) through which a piezoelectric material made of a metal oxide is obtained by applying and drying of a solution, in which a metal complex is dissolved and dispersed in a solvent, and then by baking the dried resultant to a high temperature. The method is not limited to the CSD method, but a sol-gel method, a laser ablation method, a sputtering method, a pulse laser deposition method (PLD method), a CVD method, an aerosol deposition method, or the like may be used.

Next, as illustrated in FIGS. 8A to 8C, the piezoelectric layer 70 is subjected to patterning for each piezoelectric element 300. Subsequently, the second electrode 80 is formed on the surfaces of the piezoelectric layer 70, the first electrode 60, and the vibrating plate 50 (second surface 50b of the vibrating plate 50) using the sputtering method, thermal oxidation, or the like. Also, as illustrated in FIGS. 9A to 9C, the second electrode 80 is subjected to patterning so as to be divided for each row in the second direction Y and to be continuous for each column in the first direction X. In this manner, the piezoelectric element 300 including the first electrode 60, the piezoelectric layer 70, and the second electrode 80, is formed on the second surface 50b of the vibrating plate 50.

Further, a resist (not illustrated) is provided on the surface of the silicon wafer 110 (10) for the substrate, which is opposite to the piezoelectric element 300, the resist is subjected to patterning to have a predetermined shape, and a mask film (not illustrated) is formed. Also, the silicon wafer 110 (10) for the substrate is subjected to anisotropic etching (wet-etching) through the mask film, using an alkaline solution such as KOH. In this manner, the space 12 is formed in a region of the substrate 10 facing the piezoelectric element 300.

Then, the respective members are provided in order and the ultrasonic sensor 1 illustrated in FIG. 2 is prepared. In other words, the surrounding plate 40 and the support member 41 adhere to the ultrasonic sensor element 310 side using an adhesive such that the support member 41 is not overlapped with the piezoelectric element 300. Also, the sonic adjustment layer 13 is provided in the space 12 and adhesion of the lens member 20 thereto is performed through the sonic adjustment layer 13. The sonic adjustment layer 13 and the lens member 20 are provided, and then the surrounding plate 40 and the support member 41 may adhere to the ultrasonic sensor element 310 side.

Embodiment 2

Figure 10A:
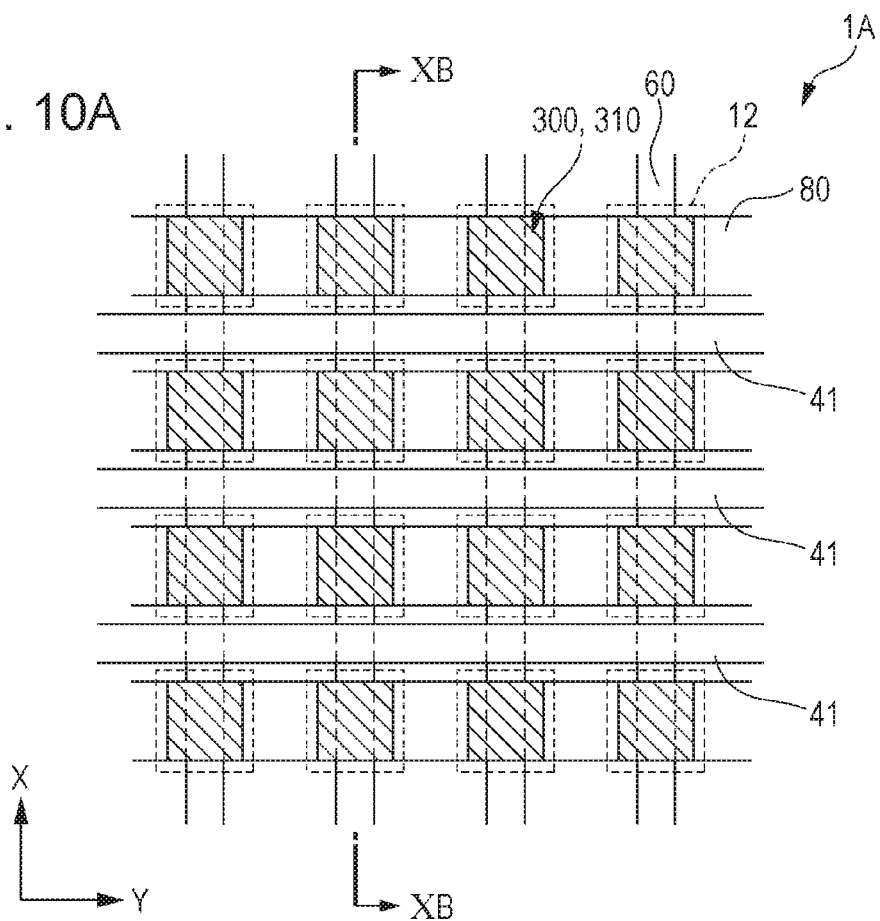
FIGS. 10A and 10B are a plan view and a sectional view illustrating the configurational example of the ultrasonic sensor.
Figure 10B:
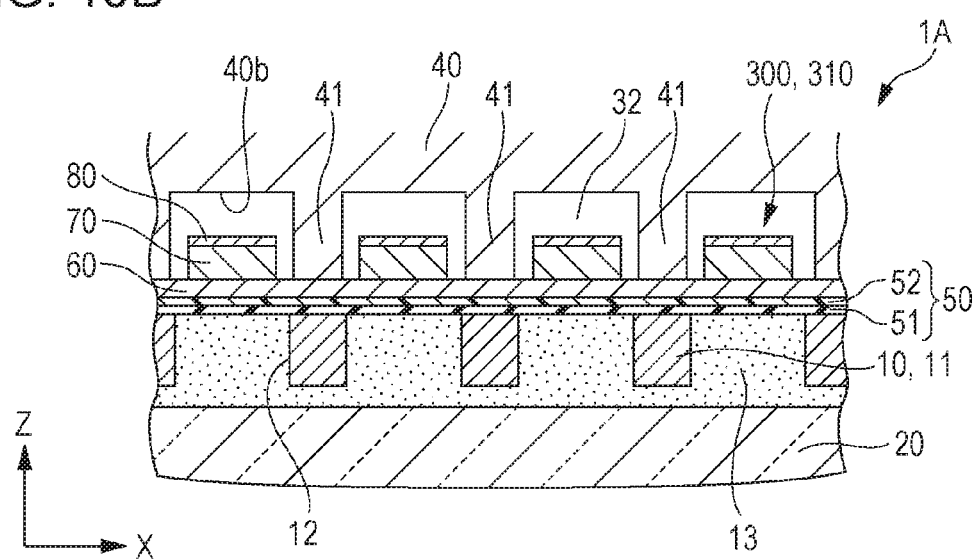

FIG. 10A is a plan view of the substrate of the ultrasonic sensor. FIG. 10B is a sectional view taken along line XB-XB in FIG. 10A. Hereinafter, an ultrasonic sensor 1A will be described with the same description as in the above embodiment appropriately omitted.

In the ultrasonic sensor 1A, the support members 41 having the beam shape extending in the second direction Y are juxtaposed in the first direction X. In this manner, the vibrating plate 50 can be supported in a broad range over in the first direction X and the second direction Y. Hence, it is possible to ensure higher reliability. The support member 41 is provided at a position at which the support member is not overlapped with the piezoelectric element 300. Therefore, even in the case where the support members 41 are arranged in the first direction X, the piezoelectric element 300 avoids being excessively restricted by the support member 41.

In the ultrasonic sensor 1A, the support member 41 having the beam shape is provided for every adjacent piezoelectric elements 300. As described above, there is no limitation to the number of the support members 41. The number of the support members 41 is increased, thereby making it possible to support the entire vibrating plate 50. Meanwhile, when the number of the support members 41 is increased, high processing accuracy is necessary in some cases.

Embodiment 3

Figure 12A:
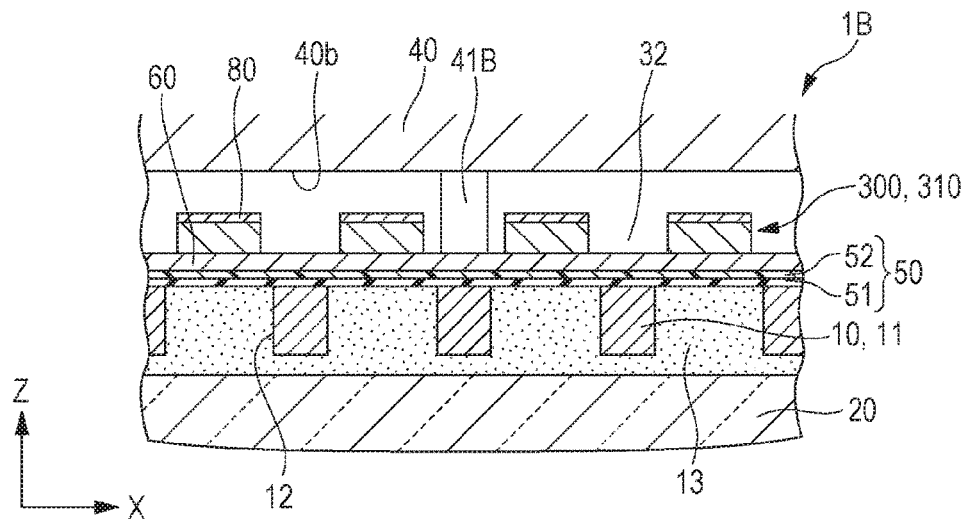
FIGS. 12A and 12B are sectional views illustrating the configurational example of the ultrasonic sensor.
Figure 12B:
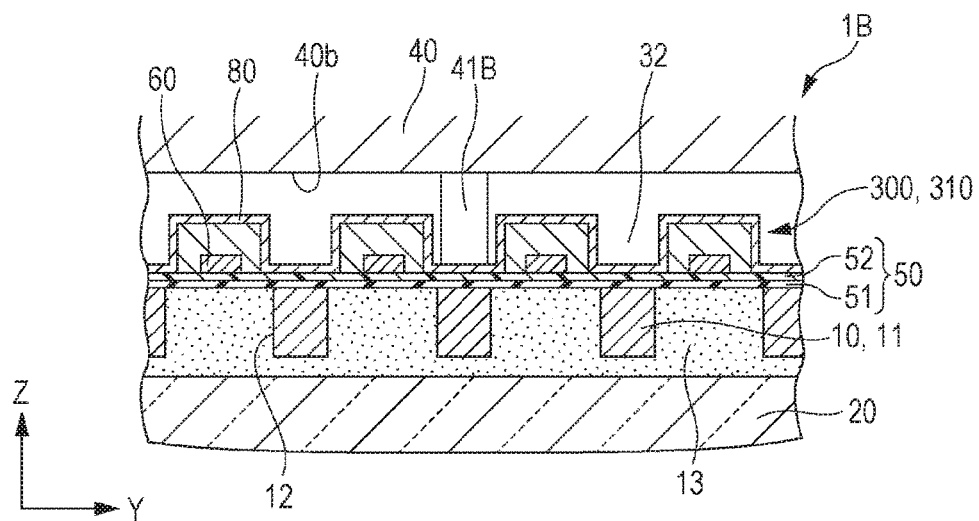

FIG. 11 is a plan view of the substrate of the ultrasonic sensor. FIG. 12A is a sectional view taken along line XIIA-XIIA in FIG. 11. FIG. 12B is a sectional view taken along line XIIB-XIIB in FIG. 11. The plan view illustrates the substrate of the ultrasonic sensor. Hereinafter, an ultrasonic sensor 1B will be described with the same description as in the above embodiments appropriately omitted.

In the ultrasonic sensor 1B, a support member 41B has a column shape and is in contact with the surrounding plate 40 only in the third direction Z. It is easy for the support member 41B having the column shape to support the vibrating plate 50 at a particular target position. For example, the support member 41B is provided so as to support the central position C (refer to FIG. 1 or the like) of the vibrating plate 50.

The support member 41B having the column shape is produced through dry-etching of the surrounding plate 40. Although dry-etching needs a processing time, compared to wet-etching, it is possible to perform the process with high accuracy regardless of a crystal plane orientation of the silicon substrate and, thus, dry-etching is a technique suitable for producing the support member 41B having the column shape. Further, since high processing accuracy is also required in the case where the number of the support members 41 having the beam shape described above is significantly increased, dry-etching is also useful for the case.

Next, an example of the manufacturing method for the ultrasonic sensor 1B will be described. FIGS. 13A to 14C illustrate respective processes of the manufacturing method for the ultrasonic sensor and are plan views in the third direction Z, sectional views taken along lines XIIIB-XIIIB and XIVB-XIVB, and sectional views taken along lines XIIIC-XIIIC and XIVC-XIVC, respectively. The lines XIIIB-XIIIB and XIVB-XIVB are along the first direction X and lines XIIIC-XIIIC and XIVC-XIVC are along the second direction Y.

The manufacturing method for the ultrasonic sensor 1B is the same as the manufacturing method in Embodiment 1 except that the support member 41B having the column shape is produced through dry-etching. Therefore, only the processes of the manufacturing method for the surrounding plate 40 side will be described.

Figure 13A:
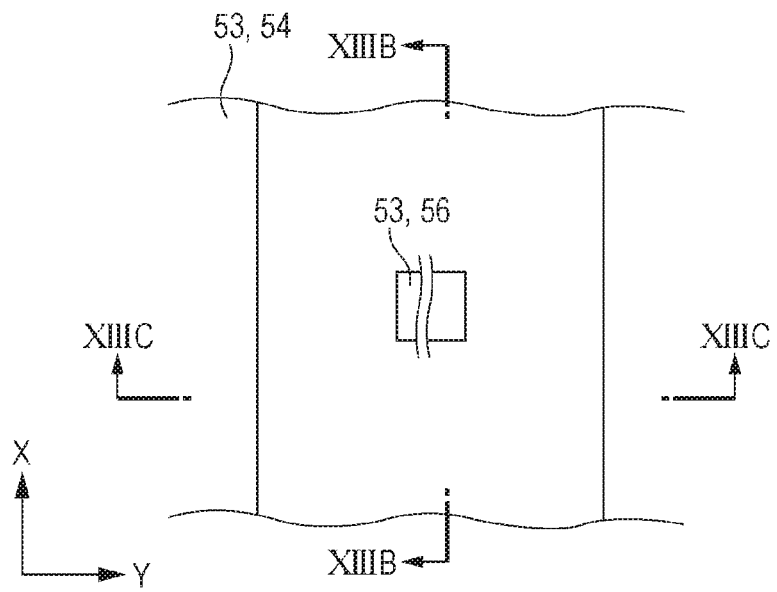
FIGS. 13A to 13C are views illustrating the manufacturing example (surrounding plate side) of the ultrasonic sensor.
Figure 13B:
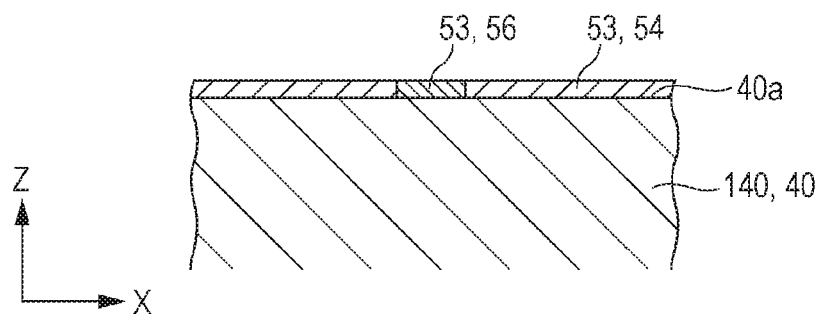
Figure 13C:
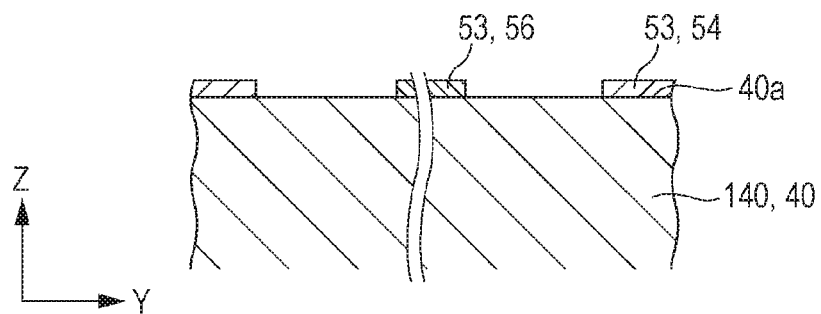

First, as illustrated in FIGS. 13A to 13C, a resist (not illustrated) is provided on the surface of the silicon wafer 140 (40) for the surrounding plate, the resist is subjected to patterning so as to have a predetermined shape, and the mask film 53 is formed. Here, the mask film 54 is formed on the edge portion 40a of the silicon wafer 140 (40) for the surrounding plate and a mask film 56 is formed so as to be discontinuous from the mask film 54.

Figure 14A:
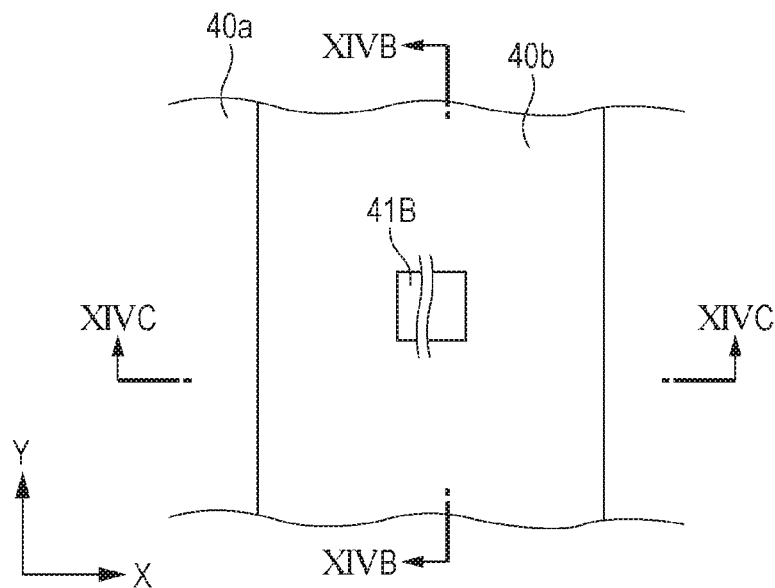
FIGS. 14A to 14C are views illustrating the manufacturing example (surrounding plate side) of the ultrasonic sensor.
Figure 14B:
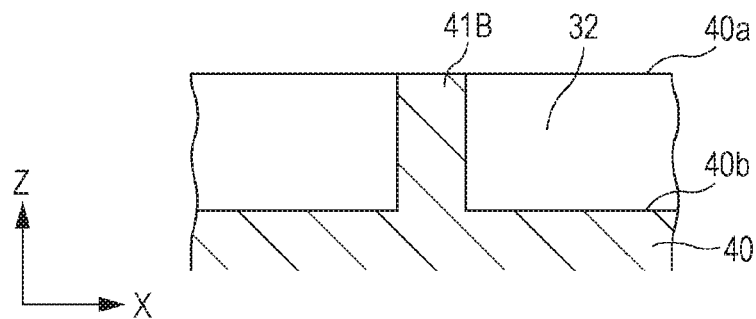
Figure 14C:
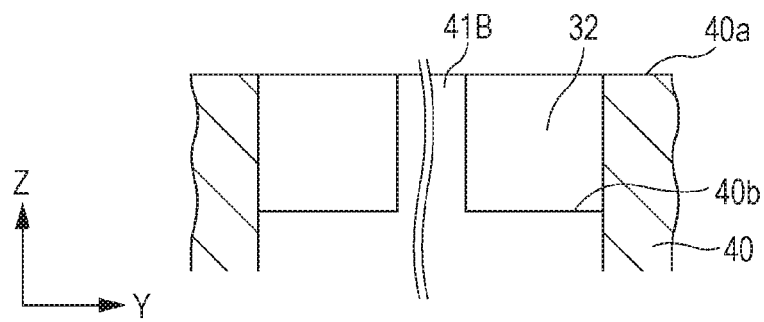

Also, as illustrated in FIGS. 14A to 14C, the silicon wafer 140 (40) for the surrounding plate is subjected to dry-etching through the mask film 53. In this manner, the surrounding plate 40, in which the support member 41 and the piezoelectric element holding portion 32 are formed, is produced. Then, the mask film 54 remaining on the edge portion 40a or the mask film 56 remaining on the support member 41B are removed. Except for this, Embodiment 3 is the same as Embodiment 1. Further, in FIGS. 14A to 14C, a processing cross section is formed with high accuracy compared to the case in FIG. 6A. As described above, although dry-etching needs a processing time, compared to wet-etching, it is possible to perform the process with high accuracy regardless of a crystal plane orientation of the silicon substrate.

Embodiment 4

Figure 15:
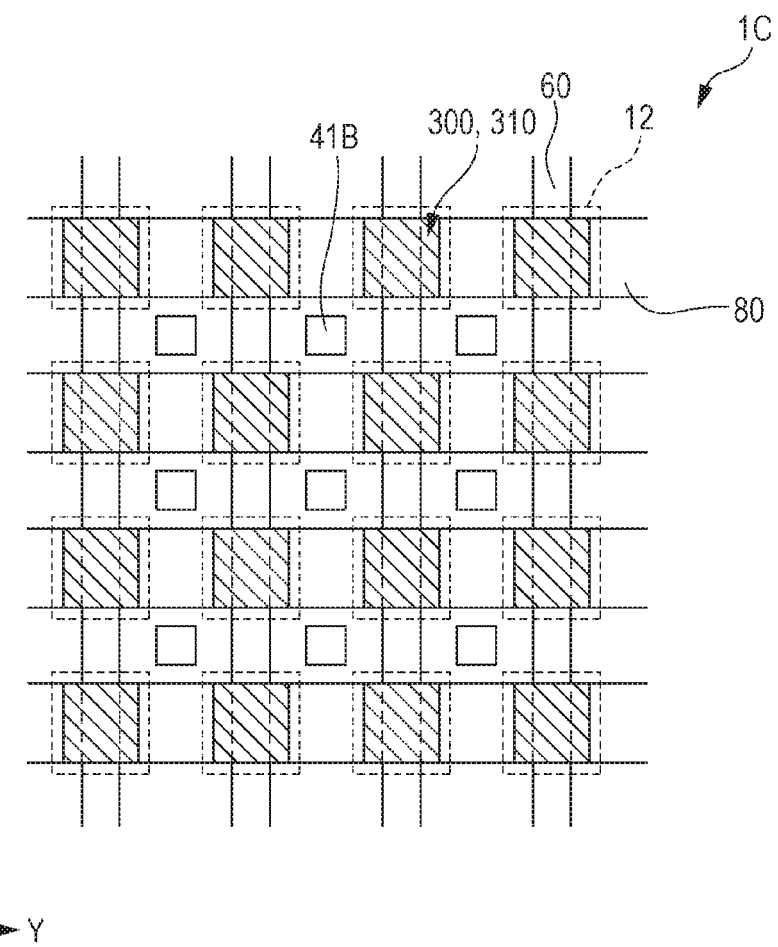
FIG. 15 is a plan view illustrating the configurational example of the ultrasonic sensor.

FIG. 15 is a plan view of the substrate of the ultrasonic sensor. Hereinafter, an ultrasonic sensor 1C will be described with the same description as in the above embodiments appropriately omitted.

In the ultrasonic sensor 1C, the support members 41B having the column shape are juxtaposed in the first direction X and the second direction Y. In this case, the vibrating plate 50 can be supported in a broad range including the particular target position. The support members 41B having the column shape may be juxtaposed in at least one direction of the first direction X and the second direction Y.

Embodiment 5

Ultrasonic Sensor

Figure 17A:
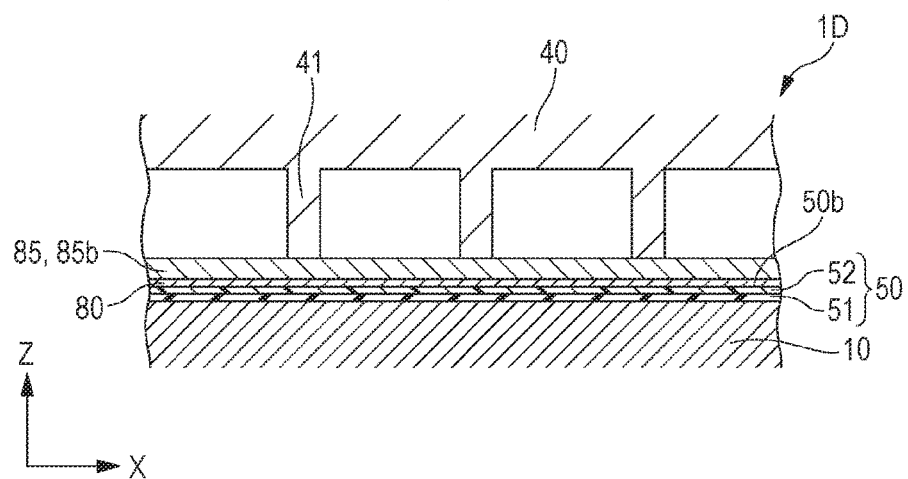
FIGS. 17A and 17B are sectional views illustrating the configurational example of the ultrasonic sensor.
Figure 17B:
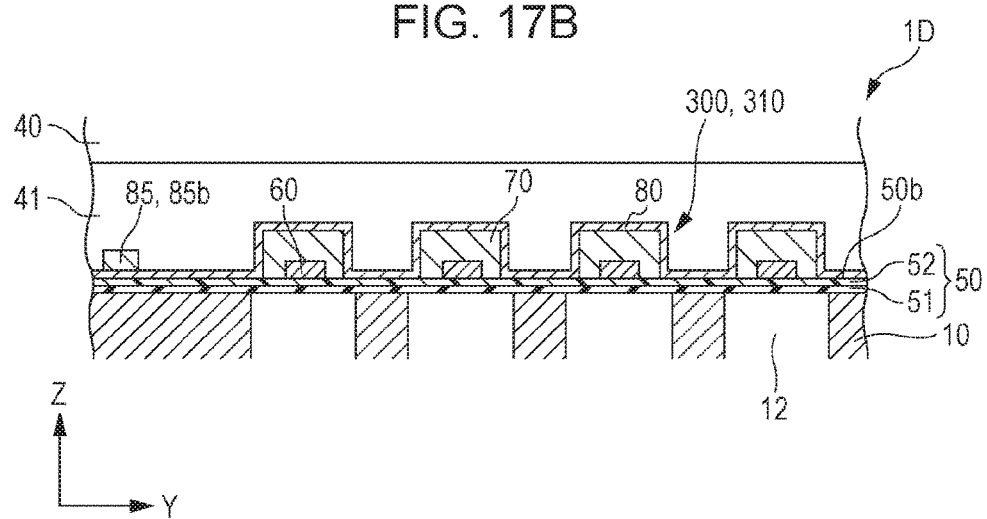

FIG. 16 is a plan view of the substrate of the ultrasonic sensor. FIG. 17A is a sectional view taken along line XVIIA-XVIIA in FIG. 16. FIG. 17B is a sectional view taken along line XVIIB-XVIIB in FIG. 16. Hereinafter, an ultrasonic sensor 1D will be described with the same description as in the above embodiments appropriately omitted.

In the ultrasonic sensor 1D, one electrode of the first electrode 60 and the second electrode 80 is an individual electrode used to drive each column or each set of a plurality of columns, the other electrode is a common electrode, and a bypass electrode 85 is provided so as to be connected to the common electrode. Here, the first electrode 60 is the individual electrode used to drive each set of a plurality of columns, and the second electrode 80 is the common electrode.

In other words, in the ultrasonic sensor 1D, 16 ultrasonic sensor elements 310 are juxtaposed in the first direction X (slicing direction) and 64 ultrasonic sensor elements 310 are juxtaposed in the second direction Y (scanning direction). The first electrode 60 can be used to drive each set of four columns extending in the first direction X. The second electrodes 80 are provided so as to be continuous for each row extending in the second direction Y.

The bypass electrode 85 has a first extending portion 85a extending in the second direction Y and a second extending portion 85b that is continuous from the first extending portion 85a and extends in the first direction X. The second electrode 80 extending in the second direction Y is connected to the second extending portion 85b. Four columns of the first electrode 60 are provided in the first direction X, and thereby the second extending portion 85b is provided so as to be connected to the first extending portion 85a.

The bypass electrode 85 is provided, thereby making it possible to achieve an averaged increase in the impedance of the common electrode in some cases. In this case, in the ultrasonic sensor 1D, it is possible to ensure high reliability and it is also possible to achieve improvement of the transmission efficiency or the reception efficiency.

It is preferable that materials of the bypass electrode 85 be different from those of the first electrode or the second electrode 80, and are low in electrical resistivity and, thus, the materials of the bypass electrode can include gold, silver, copper, aluminum, or the like. In the ultrasonic sensor 1D, gold is used. In a case where wiring of the gold is formed, it is preferable that a base layer made of nichrome be formed as a base. The bypass electrode 85 may not need to be a single layer but may be stacked films of two or more layers. In the stacked case, it is preferable that the entire electrical resistivity be less than that of the second electrode 80.

Although not illustrated, in order to prevent the increase in the impedance in an extending direction of the first electrode 60, in addition to the bypass electrode 85 continuous to the second electrode 80, a bypass electrode (second bypass electrode) continuous to the first electrode 60 may be further provided. The second bypass electrode can be configured to include a first extending portion extending in the first direction X as the extending direction of the first electrode 60, and a second extending portion connecting the first extending portion and the first electrode in each column.

It is preferable that the bypass electrode be provided above the first electrode 60 or the second electrode 80 in a region in which the bypass electrode is overlapped with the first electrode 60 or the second electrode 80. In this manner, it is possible to improve yield in manufacturing and it is possible to achieve further improvement in reliability. Conversely, a layer of gold, for example, is stacked on the region in which the first electrode 60 or the second electrode 80 is formed in advance and the layer, as the bypass electrode, exhibits the function described above.

The bypass electrode 85 may be a thick or thin film. It is preferable that a product (hereinafter, referred to as an "α value") of Young's modulus of a constituent material, a film thickness, and a width on the short side of the bypass electrode 85 be greater than an α value of the second electrode 80. Thus, when the bypass electrode 85 is formed as a thin film, it is easy to satisfy a relationship of the α value described above. In comparison, when the bypass electrode 85 is a thick film, a significant step is formed with the vibrating plate 50. It is difficult to obtain good adhesiveness of the support member 41 over the bypass electrode 85 and the vibrating plate 50 depending on the size of the step. In this case, it is also possible not to form the bypass electrode 85 in the region in which adhesion of the surrounding plate 40 or the support member 41 to the ultrasonic sensor element is performed (the bypass electrode is formed to have a striped shape).

In the ultrasonic sensor 1D, the support member 41 is provided at a position, at which the support member is not overlapped with the piezoelectric element 300, between the surface 40b of the surrounding plate 40 on the piezoelectric element 300 side and the second surface 50b of the vibrating plate 50. Here, the support member 41 having the beam shape extending in the second direction Y is provided. The support members 41 having the beam shape are juxtaposed in the first direction X. In other words, the support members 41 having the beam shape are provided between the adjacent first electrodes 60 so as to be provided along the first electrode 60.

In the ultrasonic sensor 1D, the bypass electrode 85 is continuously provided regardless of the presence of a member above the bypass electrode. In other words, the edge portion 40a of the surrounding plate 40 or the support member 41 adheres to the ultrasonic sensor element 310 side through at least the bypass electrode 85.

Manufacturing Method

Next, an example of the manufacturing method for the ultrasonic sensor 1D will be described. The manufacturing method for the ultrasonic sensor 1D is the same as the manufacturing method for Embodiment 2 except that a configuration related to the bypass electrode is produced.

In other words, the piezoelectric element 300 is produced by using the same technique as the manufacturing method for Embodiment 2. After the piezoelectric element 300 is produced, a base layer made of nickel chrome or the like and a gold layer are formed and the bypass electrode 85 is produced through patterning. The process of forming the bypass electrode 85 may be performed before or after the space 12 is formed. Then, the surrounding plate 40 and the support member 41 adhere to the ultrasonic sensor element 310 side, using an adhesive.

Embodiment 6

Figure 18:
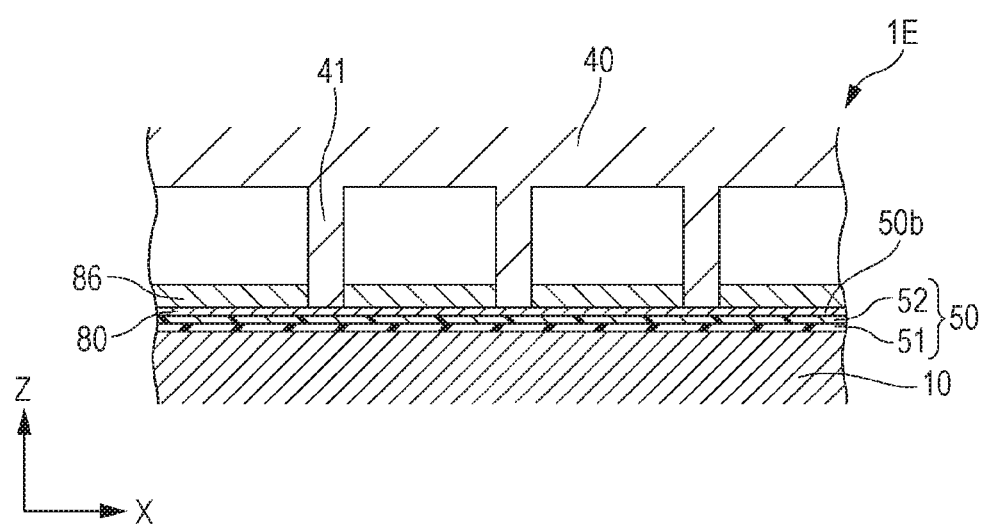
FIG. 18 is a sectional view illustrating the configurational example of the ultrasonic sensor.

FIG. 18 is a sectional view of the ultrasonic sensor. The sectional view is taken along line XVIII-XVIII in FIG. 16. Hereinafter, an ultrasonic sensor 1E will be described with the same description as in the above embodiments appropriately omitted.

In the ultrasonic sensor 1E, a bypass electrode 86 is provided, except for a region in which adhesion of the edge portion 40a of the surrounding plate 40 or the support member 41 to the ultrasonic sensor element is performed. In other words, in the ultrasonic sensor 1E, the bypass electrode 86 is provided so as to have a striped shape when viewed in the third direction Z. In this manner, the surrounding plate 40 and the support member 41 easily adhere to the ultrasonic sensor element 310 side. In addition, there is no concern that the adhesiveness of the surrounding plate 40 and the support member 41 to the ultrasonic sensor element 310 will be adversely affected by the bypass electrode 85.

A manufacturing method for the ultrasonic sensor 1E is the same as the manufacturing method in Embodiment 5 except that the bypass electrode 86 having the striped shape is produced. The bypass electrode is not formed in the region in which the adhesion of the surrounding plate 40 or the support member 41 to the ultrasonic sensor element is performed. In this manner, the bypass electrode 86 having the striped shape is produced.

Another Embodiment

As above, embodiments of the invention are described. However, a basic configuration of the invention is not limited to the aspects described above. The embodiments described above can be combined with each other. For example, the support member having the column shape can be provided in the ultrasonic sensor including the bypass electrode.

In addition, in FIG. 2, the aspect, in which the multiple ultrasonic sensor elements collectively are arranged, is described as an example, a plurality of ultrasonic sensor elements may be provided and, thus, two ultrasonic sensor elements may be provided. The invention is, in general, applied to the CAV surface type ultrasonic sensor as a target, and can be applied to any type of ultrasonic sensor such as a transmission-only type ultrasonic sensor, a reception-only type ultrasonic sensor, and a transmission-reception integral type ultrasonic sensor.

The ultrasonic sensor of the invention can be applied to various ultrasonic devices. Particularly, the CAV surface type ultrasonic sensor has good electrical safety during use, compared to the ACT surface type ultrasonic sensor. Therefore, since the CAV surface type ultrasonic sensor has good safety or the like, the CAV surface type ultrasonic sensor can be appropriately used in a medical apparatus in which a leakage current is a major concern, for example, an ultrasonic diagnostic apparatus, a sphygmomanometer, and a tonometer.

The ultrasonic sensor of the invention can be used as various pressure sensors. For example, the ultrasonic sensor can be applied as a sensor that detects pressure of ink in a liquid ejecting apparatus such as a printer. In addition, the configuration of the ultrasonic sensor of the invention can be preferably applied to an ultrasonic motor, a piezoelectric transformer, a vibration type dust removing device, a pressure electric conversion machine, an ultrasonic transmitter, an acceleration sensor, or the like. A complete body obtained by using the configurations of the types of ultrasonic sensors, for example, a robot in which the ultrasonic sensor described above is mounted, or the like, is included in the ultrasonic device.

The components illustrated in the drawings, that is, a shape and size of the respective members, a thickness of the layer, a relative positional relationship, a repeated unit, or the like is magnified in the description of the invention, in some cases. In addition, in the specification, the term, "on", is not limited to the term, "immediately on", in a positional relationship between the components. For example, the description, "the piezoelectric element on the substrate" or "the support member on the vibrating plate" does not exclude a state in which another component is included between the substrate and the piezoelectric element, or between the vibrating plate and the support member.

The entire disclosure of Japanese Patent Application No. 2015-061755, filed Mar. 24, 2015 is expressly incorporated by reference herein.

What is claimed is:

1. An ultrasonic sensor comprising:
    a substrate disposed on an XY plane, the XY plane being a plane a formed by an X axis and a Y axis that are orthogonal to each other;
    a plurality of spaces formed in the substrate in at least one of an X-axis direction along the X axis and a Y-axis direction along the Y axis so that the substrate is configured with the plurality of spaces and a plurality of partition walls that are alternatively provided relative to the plurality of spaces;
    a vibrating plate that is provided on the substrate and that has a first surface and a second surface opposite to each other, the first surface being directly on the substrate, the vibrating plate spanning entirely across at least two of the plurality of spaces so that the two of the plurality of spaces are overlapped by the vibrating plate in a plan view;
    a plurality of piezoelectric elements that are provided at discrete positions on the second surface of the vibrating plate, the discrete positions correspondingly aligning with the plurality of spaces, each of the plurality of piezoelectric elements being configured to transmit and receive an ultrasonic wave;
    a surrounding plate that is provided above the second surface of the vibrating plate and that surrounds a peripheral region of the plurality of piezoelectric elements; and
    a support member provided between an inner surface of the surrounding plate and the second surface of the vibrating plate at a position corresponding to one of the plurality of partition walls in the plan view,
    wherein the discrete positions are completely interior of the plurality of spaces in the plan view so that the plurality of piezoelectric elements are inboard the plurality of partition walls in the plan view.

2. The ultrasonic sensor according to claim 1,
    wherein the support member has a beam shape extending in one of the X-axis direction and the Y-axis direction.

3. The ultrasonic sensor according to claim 2,
    wherein the support member is configured with a plurality of the support members, and
    wherein the plurality of the support members are juxtaposed in the other of the X-axis direction and the Y-axis direction.

4. The ultrasonic sensor according to claim 1,
    wherein the support member has a columnar shape and is in contact with the inner surface of the surrounding plate only in a Z-axis direction along a Z axis, wherein the Z axis is orthogonal to both the X axis and the Y axis.

5. The ultrasonic sensor according to claim 4,
    wherein the support member is configured as a plurality of support members, and
    wherein the plurality of support members are juxtaposed in at least one of the X-axis direction and the Y-axis direction.

6. The ultrasonic sensor according to claim 1,
    wherein each of the plurality of piezoelectric elements is configured with a first electrode which is formed on the second surface of the substrate, a piezoelectric layer which is formed on the first electrode, and a second electrode which is formed on the piezoelectric layer,
    wherein one electrode of the first electrode and the second electrode is an individual electrode, the individual electrode is configured to drive each column or each set of a plurality of columns of the plurality of piezoelectric elements, and the other electrode is a common electrode for the plurality of piezoelectric elements, and
    wherein a bypass electrode is continuously provided from the common electrode.

7. The ultrasonic sensor according to claim 6,
    wherein the bypass electrode is spaced apart from the support member in the plan view.

8. The ultrasonic sensor according to claim 1,
    wherein the plurality of spaces formed in the substrate are a plurality of through holes, and
    the vibrating plate spans entirely across at least two of the plurality of through holes so that the two of the plurality of through holes are closed by the vibrating plate in the plan view.

9. The ultrasonic sensor according to claim 8,
    wherein the support member has a beam shape extending in one of the X-axis direction and the Y-axis direction.

10. The ultrasonic sensor according to claim 9,
    wherein the support member is configured as a plurality of support members, and
    wherein the plurality of support members are juxtaposed in the other of the X-axis direction and the Y-axis direction.

11. The ultrasonic sensor according to claim 8,
    wherein the support member has a columnar shape and is in contact with the inner surface of the surrounding plate only in a Z-axis direction along a Z axis, wherein the Z axis is orthogonal to both the X axis and the Y axis.

12. The ultrasonic sensor according to claim 11,
    wherein the support member is configured as a plurality of support members, and wherein the plurality of support members are juxtaposed in at least one of the X-axis direction and the Y-axis direction.

13. The ultrasonic sensor according to claim 8,
wherein each of the plurality of piezoelectric elements is configured with a first electrode which is formed on the second surface of the substrate, a piezoelectric layer which is formed on the first electrode, and a second electrode which is formed on the piezoelectric layer,
wherein one electrode of the first electrode and the second electrode is an individual electrode, the individual electrode is configured to drive each column or each set of a plurality of columns of the plurality of piezoelectric elements, and the other electrode is a common electrode for the plurality of piezoelectric elements, and
wherein a bypass electrode is continuously provided from the common electrode.

14. A manufacturing method for an ultrasonic sensor, the ultrasonic sensor including:
a substrate disposed on an XY plane, the XY plane being a plane formed by an X axis and a Y axis that are orthogonal to each other;
a plurality of spaces formed in the substrate;
a vibrating plate that is provided on the substrate;
a plurality of piezoelectric elements that are provided at discrete positions on the vibrating plate; and
a surrounding plate with a support member that is provided on the vibrating plate,
the manufacturing method comprising:
providing the vibrating plate on the substrate, the vibrating plate having a first surface and a second surface opposite to each other, the first surface being directly on the substrate;
providing the plurality of piezoelectric elements at discrete positions on the second surface of the vibrating plate, each of the plurality of piezoelectric elements being configured to transmit and receive an ultrasonic wave;
providing the plurality of spaces in the substrate in at least one of an X-axis direction along the X axis and a Y-axis direction along the Y axis so that the substrate is configured with the plurality of spaces and a plurality of partition walls that are alternatively provided relative to the plurality of spaces, the vibrating plate spanning entirely across at least two of the plurality of spaces so that the two of the plurality of spaces are overlapped by the vibrating plate in a plan view, the discrete positions correspondingly aligning with the plurality of spaces; and
providing the surrounding plate with the support member on the second surface of the vibrating plate so that the surrounding plate surrounds a peripheral region of the plurality of piezoelectric elements, the support member being provided between an inner surface of the surrounding plate and the second surface of the vibrating plate at a position corresponding to one of the plurality of partition walls in the plan view,
wherein the discrete positions are completely interior of the plurality of spaces in the plan view so that the plurality of piezoelectric elements are inboard the plurality of partition walls in the plan view.

15. The manufacturing method for an ultrasonic sensor according to claim 14, further comprising:
forming the support member by wet-etching the surrounding plate so that the support member is beam-shaped extending in one of the X-axis direction and the Y-axis direction.

16. The manufacturing method for an ultrasonic sensor according to claim 14, further comprising:
forming the support member by dry-etching so that the support member is column-shaped and is in contact with the inner surface of the surrounding plate only in a Z-axis direction along a Z axis, wherein the Z axis is orthogonal to both the X axis and the Y axis.

17. The manufacturing method for an ultrasonic sensor according to claim 14,
wherein the plurality of spaces formed in the substrate are a plurality of through holes, and
the vibrating plate spans entirely across at least two of the plurality of through holes so that the two of the plurality of through holes are closed by the vibrating plate in the plan view.

18. The manufacturing method for an ultrasonic sensor according to claim 17, further comprising:
forming the support member by wet-etching the surrounding plate so that the support member is beam-shaped extending in one of the X-axis direction and the Y-axis direction.

19. The manufacturing method for an ultrasonic sensor according to claim 17, further comprising:
forming the support member by dry-etching so that the support member is column-shaped and is in contact with the inner surface of the surrounding plate only in a Z-axis direction along a Z axis, wherein the Z axis is orthogonal to both the X axis and the Y axis.

* * * * *